United States Patent
Gibbins et al.

(10) Patent No.: US 6,288,969 B1
(45) Date of Patent: Sep. 11, 2001

(54) MULTI-PORT RANDOM ACCESS MEMORY

(75) Inventors: Robert George Gibbins, Ottawa; Garnet Frederick Randall Gibson, Nepean; Steven William Wood, Kanata, all of (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 08/899,818

(22) Filed: Jul. 24, 1997

Related U.S. Application Data

(63) Continuation of application No. 08/719,306, filed on Sep. 19, 1996, now Pat. No. 5,742,557.
(60) Provisional application No. 60/020,816, filed on Jun. 20, 1996.

(51) Int. Cl.[7] .......................................... G11C 8/00
(52) U.S. Cl. .................. 365/230.05; 365/201; 365/154; 365/189.04
(58) Field of Search ............................... 365/230.05, 154, 365/189.04, 201

(56) References Cited

U.S. PATENT DOCUMENTS

| | | | |
|---|---|---|---|
| 5,384,734 | * | 1/1995 | Tsujihashi et al. ............. 365/189.04 |
| 5,398,047 | * | 3/1995 | Nara et al. ................... 365/230.05 X |
| 5,493,536 | * | 2/1996 | Aoki ................................. 365/154 X |
| 5,574,692 | * | 11/1996 | Dierke ..................................... 365/200 |
| 5,590,087 | * | 12/1996 | Chung et al. .................... 365/230.05 |
| 5,734,613 | * | 3/1998 | Gibson ............................. 365/189.04 |

OTHER PUBLICATIONS

Siburt, A.L., et al, "A 180–Mhz 0.8–um BiCMOS Modular Memory Family of DRAM and Multiport SRAM", IEEE Journal of Solid–State Circuits, vol 28, No. 3, Mar. 1993, pp. 222–232.

Nadeau–Dostie, B., et al, "Serial Interfacing for Embedded–Memory Testing", IEEE Design & Test of Computers, Apr. 1990, pp. 52–63.

* cited by examiner

Primary Examiner—Huan Hoang
(74) Attorney, Agent, or Firm—Angela C. de Wilton

(57) ABSTRACT

Disclosed is an architecture of a RAM (random access memory) with BIST (built-in self test) or functional test function. The RAM has a memory cell for storing differential or single-ended binary data and bit line signals are fully differential or single-ended. Shadow write is applied to read only and read-write bit lines. With the test function, port-to-port bit line shorts and port-to-port word line shorts are sensitized.

11 Claims, 16 Drawing Sheets

MULTI-PORT RANDOM ACCESS MEMORY

This is a continuation of patent application Ser. No. 08/719,306, filed on Sep. 19, 1996, now U.S. Pat. No. 5,742,557 with a priority claim from a Provisional Application of Ser. No. 60/020,816 filed on Jun. 20, 1996.

TECHNICAL FIELD

The present invention relates to a multi-port RAM (random access memory) which enhances a shadow write test function.

BACKGROUND ART

Well known are RAMs which have at least one address port and include storage elements (core cells). In a paper by A. L. Silburt et al entitled "A 180-MHz 0.8-$\mu$m BiCMOS Modular Memory Family of DRAM and Multiport SRAM", IEEE Journal of Solid-State Circuits, Vol. 28, No. 3, March 1993, p. 222, at 227 shows various arrays of RAM storage elements.

In RAMs, a problem is to develop a practical, non-intrusive method for sensitizing shorts between bit lines from different ports. In a paper by B. Nadeau-Dostie et al entitled "Serial Interfacing for Embedded-Memory Testing", IEEE Design & Test of Computers, April 1990, p. 52 discloses BIST (built-in self test) architecture and memory test.

Detection of shorts due to manufacturing defects between bit lines from different ports which run parallel to each other over large distances (the "height" of the memory array) is difficult due to the small differential signal swing used in high-speed memory port architectures. Shorts between word lines from different ports are likewise difficult to detect without special test algorithms. Such faults may pass undetected by conventional BIST or functional testing means during manufacturing test and result in intermittent failures in the field. A shadow write methodology may be used to sensitize the port-to-port bit line and word line short failures during BIST or functional testing.

SUMMARY OF THE INVENTION

It is an object of the present invention to provide an improved multi-port RAM.

In accordance with one aspect of the present invention, there is provided a multi-port RAM (random access memory) comprising RAM cells of m rows by n columns, each RAM cell including storage means for storing differential binary data, the RAM cells of each column being commonly coupled to a respective set of M data paths, m, n and M being integers, the multi-port RAM further comprising: access means for conducting data access to the RAM cells via the data paths; and path select means for determining data paths so that data accessing is enabled via the selected data paths and data accessing is disabled via the non-selected data paths.

In an example, the access means comprises data read means for reading differential binary data stored in the storage means via the selected data path during a read mode. The binary data stored in the storage means is read via the selected data paths and data reading is disabled via the non-selected data paths.

In an example, the access means comprises data write and read means for: (i) storing differential binary data in the storage means via the selected data path during a write mode: and (ii) reading the differential binary data stored in the storage means via the selected data path during a read mode. The binary data is read from the storage means via the selected data paths and data reading is disabled via the non-selected data paths, during the read mode.

The multi-port RAM port architectures with the path select means (shadow write) provide a practical, non-intrusive method for sensitizing shorts between bit lines and word lines from different read-only, write-only or read-write ports within a multi-port RAM. This is an innovative test enhancement feature.

With the application of the shadow write feature, bit line and word line faults between ports of a multi-port RAM may be detected during manufacturing test by standard single-port test algorithms. This allows the integration of BIST for multi-port memories using available BIST controllers developed to test single-port memories. Only minor modifications to the BIST controller are required to enable the shadow write function and allow the multi-port memory to be treated as a number of individual single-port memories.

BRIEF DESCRIPTION OF THE DRAWINGS

Embodiments of the present invention will now be described by way of example with reference to the accompanying drawings in which.

DETAILED DESCRIPTION

I. 9-Port Memory

Figure 1:
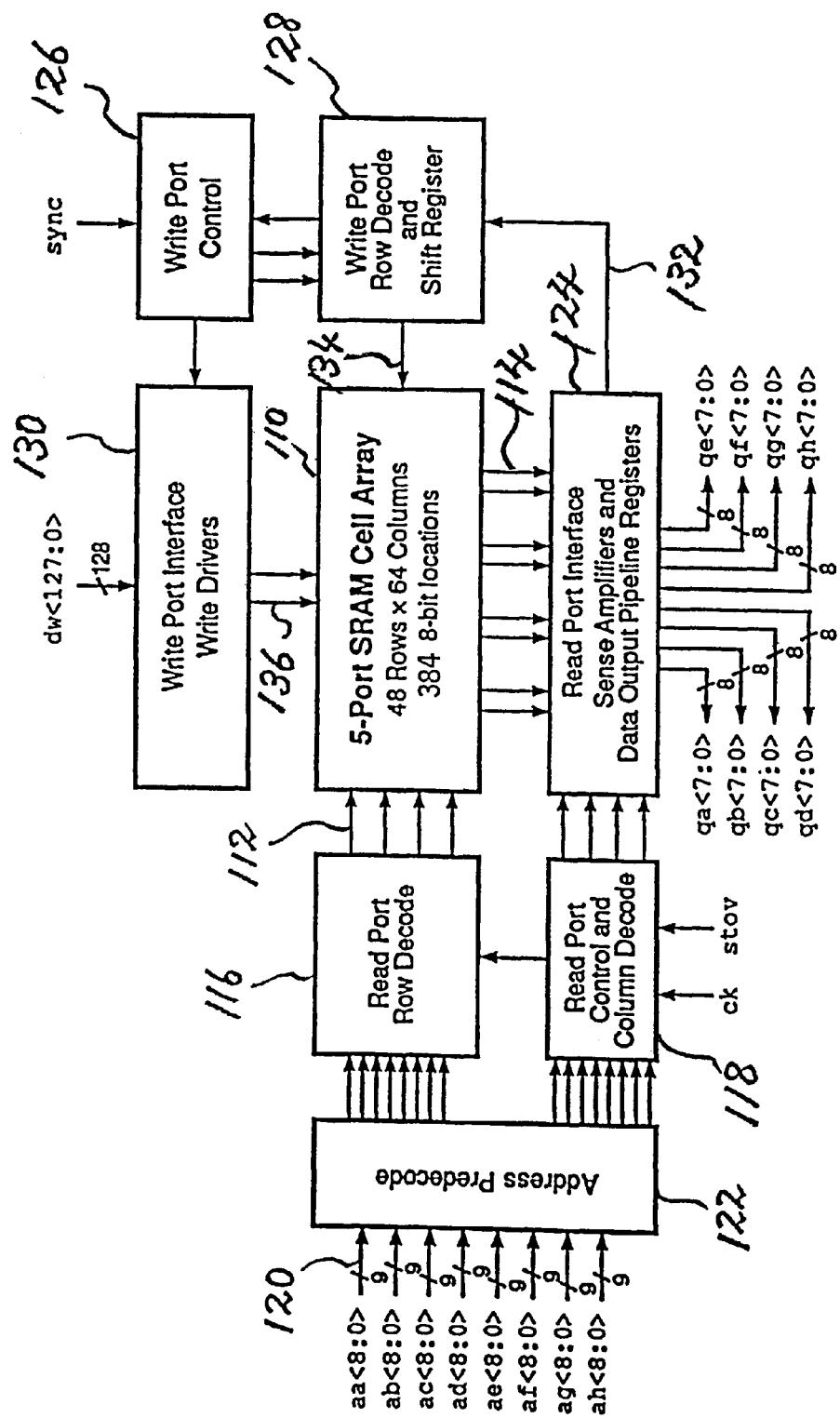
FIG. 1 is a block diagram of a multi-port RAM.

FIG. 1 shows a multi-port RAM. The 9-port SRAM (static random access memory), is configured as 384 bytes of memory storage with a single 24×128-bit (16 byte) write port and eight 384×8-bit read ports. It is implemented as a 48 row by 64 column core cell array. The 128-bit write is row interleaved with 64-bits written to each of two selected rows per write cycle to give a more optimum array aspect ratio.

A 5-port RAM cell with four fully-differential read ports and a single-ended pseudo-differential write port has been designed. Differential read ports are selected for enhanced performance relative to a more compact single-ended architecture. An indirect read-access architecture is used to eliminate multiport cell stability problems associated with multiple simultaneous accesses to a cell. The single-ended write scheme combined with row interleaving saves two write bit lines per column. A local bit line inversion scheme is used to provide a pseudo-differential write capability at the core-cell for equivalent-to-differential write performance.

The multi-port RAM has a 5-port SRAM cell array 110 with one write port and four read ports. The cell array 110 is connected to read word lines 112 and read bit lines 114. The cell array 110 has RAM cells of m (=48) rows and n (=64) columns. The address identifying the RAM cell for data reading in the cell array 110 is defined by X- and Y-address signals which are provided by a read port row decoder 116 and a read port control and column decoder 118, respectively. The address data is contained in an address signal which is present on an input bus 120, the address signal having X- and Y-address data. The address data is fed to an address predecoder 122 which provides the X- and Y-address data to the read port row decoder 116 and the read port control and column decoder 118, respectively. A data output circuit 124 is connected to the cell array 110 for data read. The multi-port RAM includes a write port control circuit 126, a write port row decoder and shift register 128 and a write port interface circuit 130. The write port row decoder and shift register 128 is connected to the data output circuit 124 through a write clock line 132. The write port row decoder and shift register 128 and write port interface circuit 130 are connected to the cell array 110 through write word lines 134 and write bit lines 136, respectively. A data write function is performed by the write port control circuit 126, the write port row decoder and shift register 128 and the write port interface circuit 130.

The 9-port operation is obtained by time multiplexing the four physical read ports in the core array. Two full read accesses to the core are performed on these ports in each clock cycle. The read data is then re-timed and latched into eight output ports for presentation to the user on the rising edge of the system clock. All read port inputs are provided to the 9-port interface at the same rising clock edge and are internally pipelined to perform the read access. Read operation is controlled by a self-timed clock generator that shuts down each read cycle as fast as possible following data access to minimize power. The self-timed operation provides nearly constant power dissipation across all process cases. The entire multiplexed read operation is initiated by a single rising edge of the system clock, simplifying the top-level interface and minimizing clock duty-cycle requirements. See U.S. Pat. No. 5,612,923 entitled "Multi-Port Random Access Memory" granted to G. F. R. Gibson et al on Mar. 18, 1997, which claims priority from United States provisional application Ser. No. 60/001,856 filed on Aug. 3, 1995, which is incorporated herein by reference.

The read memory map is customized to provide two independent data pages which can be switched with a single-bit toggle. The write port data is mapped physically, via data register placement, to match the read data map. No column decoding is required in the write-port. Since the TSI application requires sequential write addressing, a built-in write address counter is provided along with page synchronization controls to detect page switch events.

In addition, the memories are provided with an ultra-low power "no-power" mode by internally gating all interface signals, including the clock, with a power-down signal, eliminating any signal transitions within the memory while power-down is asserted.

In order to facilitate scan and BIST design methodologies, the memory interface includes built-in scan chains for address and data signals plus a special multiport test mode called shadow write. The scan chains are independently controllable, so that multi-segment chains can be supported.

The shadow write mode is provided for inter-port short detection [B. Nadeau-Dostie et al entitled "Serial Interfacing for Embedded-Memory Testing", IEEE Design & Test of Computers, April 1990, p. 52], by assertion of a combination of test mode control signals.

Figure 2:
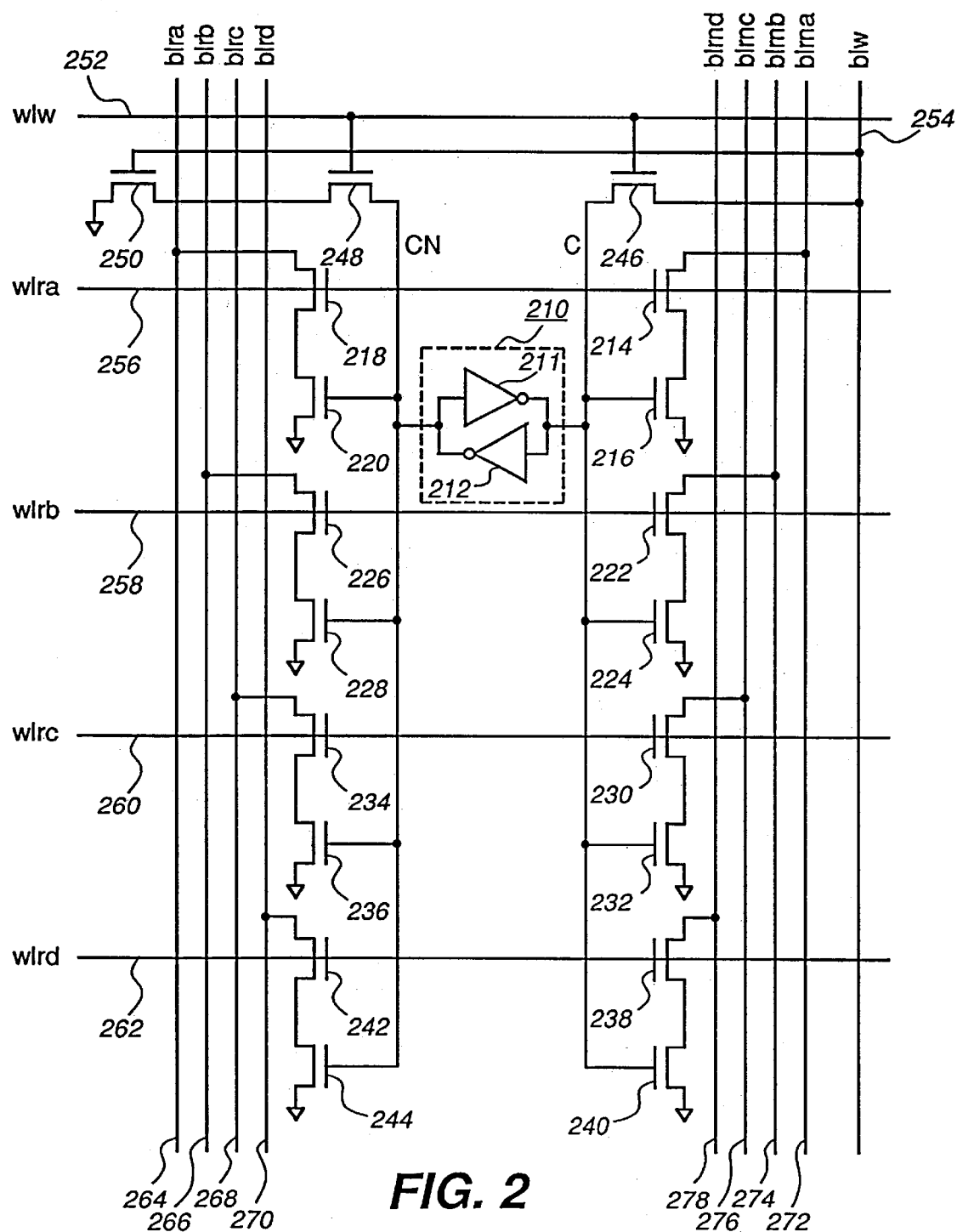
FIG. 2 is a circuit diagram of an SRAM (static random access memory) cell included in the RAM shown in FIG. 1.

The RAM cell of the multi-port SRAM core array shown in FIG. 2 consists of four differential read ports with indirect data access via gated, bit line pull-down transistors and one single-ended write-only port with local bit line inversion to give pseudo-differential write access.

The following description assumes, for simplicity and purely by way of example, that FETs referred to are MOS-FETs (metal oxide semiconductor field effect transistors) and a supply voltage +Vdd is typical (e.g., 5.0 or 3.3 volts).

The RAM cell shown in FIG. 2 has a five-port storage element and includes one write port and four differential read ports with indirect data access. The RAM cell has a latch (cell) 210 which includes two inverters 211 and 212. Each of the inverters 211 and 212 has a CMOS (complementary metal oxide semiconductor) inverter. The input and the output terminals of the inverter 211 are connected to the output and the input terminals of the inverter 212, respectively.

In FIG. 2, all FETs are N-channel FETs. The source of a FET 214 is connected to the drain of a FET 216 and the source of a FET 218 is connected to the drain of a FET 220. Similarly, the source of a FET 222 is connected to the drain of a FET 224 and the source of a FET 226 is connected to the drain of a FET 228. The source of a FET 230 is connected to the drain of a FET 232 and the source of a FET 234 is connected to the drain of a FET 236. The source of a FET 238 is connected to the drain of a FET 240 and the source of a FET 242 is connected to the drain of a FET 244.

The output terminal of the inverter 211 and the input terminal of the inverter 212 are connected to the gates of the FETs 216, 224, 232 and 240 and the drain of a FET 246. The input terminal of the inverter 211 and the output terminal of the inverter 212 are connected to the gates of the FETs 220, 228, 236 and 244 and the drain of a FET 248, the source of which is connected to the drain of a FET 250. The sources of the FETs 216, 220, 224, 228, 232, 236, 240, 244 and 250 are connected to the ground terminal.

The gates of the FETs 246 and 248 are connected to a line 252 on which a write word line signal wlw is present. The gate of the FET 250 and the source of the FET 246 are connected to a line 254 on which a write bit line signal blw representing data "zero" or "one" is present.

A line 256 on which a word line read signal wlra is present is connected to the gates of the FETs 214 and 218. A line 258 on which a word line read signal wlrb is present is connected to the gates of the FETs 222 and 226. A line 260 on which a word line read signal wlrc is present is connected to the gates of the FETs 230 and 234. A line 262 on which a word line read signal wlrd is present is connected to the gates of the FETs 238 and 242.

The drains of the FETs 218, 226, 234 and 242 are connected to lines 264, 266, 268 and 270, respectively, on which read bit line signals blra, blrb, blrc and blrd are present. The drains of the FETs 214, 222, 230 and 238 are connected to lines 272, 274, 276 and 278, respectively, on which read bit line signals blrna, blrnb, blrnc and blrnd are present. The lines 264 and 272, 266 and 274, 268 and 276, 270 and 278 are pairs of bit lines and on the respective pairs, the read bit line signals blra and blrna, blrb and blrnb, blrc and blrnc, and blrd and blrnd are which are differential signals are present.

Figure 3:
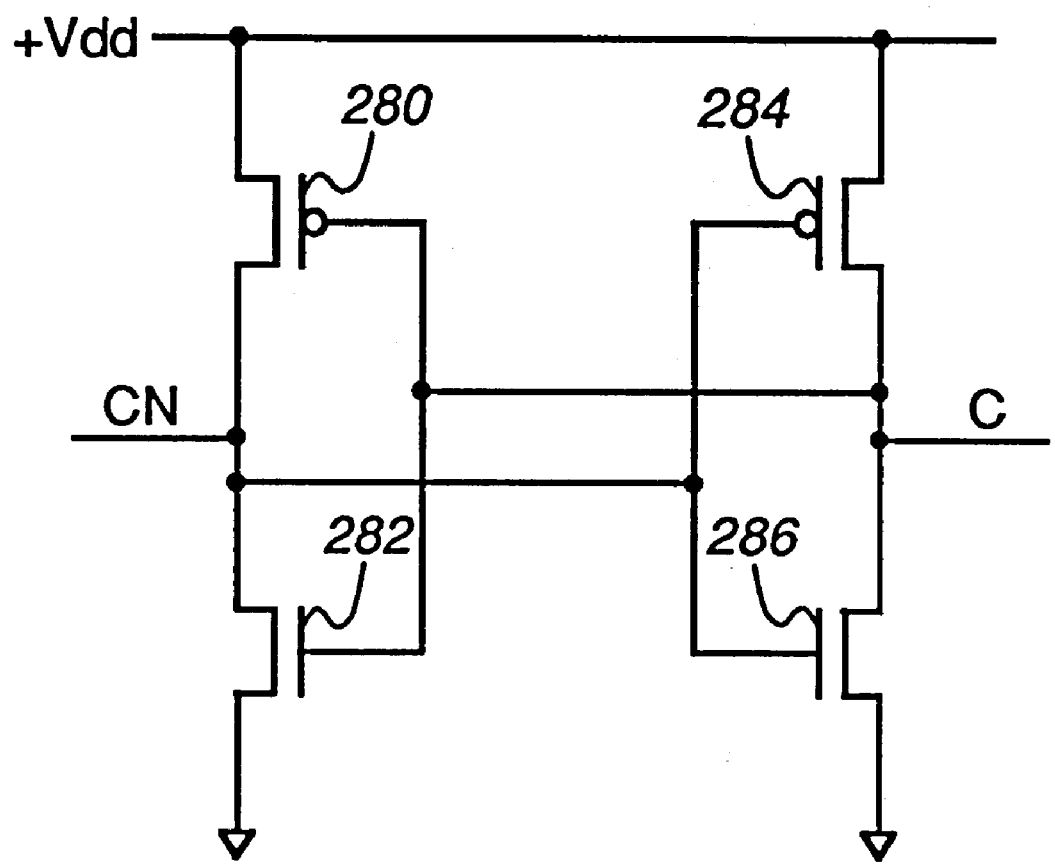
FIG. 3 is a detailed diagram of a latch shown in FIG. 2.

FIG. 3 shows a detail of the latch 210 of the multi-port RAM core array. The latch 210 is a well known RAM storage element which includes two CMOS inverters. In FIG. 3, the drains of a P-channel FET 280 (a load device) and an N-channel FET 282 (a drive device), which define one CMOS inverter, are connected to the gates of a P-channel FET 284 (a load device) and an N-channel FET 286 (a drive device), which define the other CMOS inverter. Similarly, the drains of the FETs 284 and 286 are connected to the gates of the FETs 280 and 282. The sources of the FETs 280 and 284 are connected to the voltage terminal of the supply voltage +Vdd. The sources of the FETs 282 and 286 are connected to the ground terminal. The junction of the drains of the FETs 280 and 282 defines node CN. The junction of the drains of the FETs 284 and 286 defines node C. Nodes CN and C are data input and output terminals of the latch 210.

Figure 4:
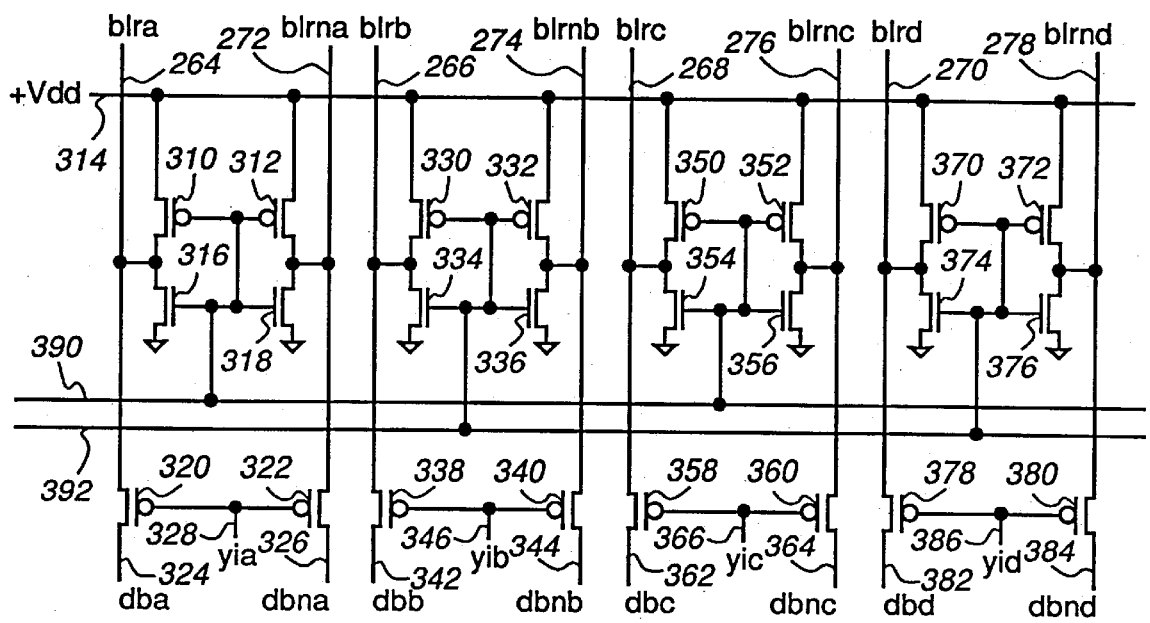
FIG. 4 is a diagram of circuitry for providing the memory column access and bit line damp with shadow write.

FIG. 4 shows circuitry for providing the memory column access and bit line clamp with shadow write. The circuitry includes first to fourth circuits for first to fourth ports a–d. In the first circuit for column a, the sources of P-channel FETs 310 and 312 are connected to a voltage supply terminal 314 of a positive voltage +Vdd. The sources of N-channel FETs 316 and 318 are connected to the ground terminal. The drains of the FETs 310 and 316 are connected to the drain of a P-channel FET 320. The drains of the FETs 312 and 318 are connected to the drain of a P-channel FET 322. A pair of lines 264 and 272 on which the read bit line signals blra and blrna are connected to the drains of the FETs 320 and 322, respectively. The sources of the FETs 320 and 322 are connected to a pair of bus lines 324 and 326 on which a-port data signals dba and dbna are present, respectively. The gates of the FETs 320 and 322 are connected to a column access signal line 328 on which an a-port column access signal yia is present. Similarly, in the second circuit for column b, the sources of FETs 330 and 332 are connected to the voltage supply terminal 314. The sources of FETs 334 and 336 are connected to the ground terminal. The drains of the FETs 330 and 334 are connected to the drain of a FET 338. The drains of the FETs 332 and 336 are connected to the drain of a FET 340. A pair of lines 266 and 274 on which the read bit line signals blrb and blrnb present are connected to the drains of the FETs 338 and 340, respectively. The sources of the FETs 338 and 340 are connected to a pair of bus lines 342 and 344 on which b-port data signals dbb and dbnb are present. The gates of the FETs 338 and 340 are connected to a column access signal line 346 on which a b-port column access signal yib is fed. Also, the third and fourth circuits for columns c and d are similar to the first circuits.

In this example, there are two shadow write lines 390 and 392. The gates of the FETs 310, 312, 316 and 318 of the first circuit and the gates of the FETs 350, 352, 354 and 356 of the third circuit are connected to the shadow write line 390 on which a shadow write a/c signal is present. The gates of the FETs 330, 332, 334 and 336 of the second circuit and the gates of the FETs 370, 372, 374 and 376 of the fourth circuit are connected to the shadow write line 392 on which another shadow write b/d signal is present.

The pairs of the pairs of the two lines 264, 272 and 268, 276 can be driven to the (ground potential, while test patterns are run on the other pairs of the two lines 266, 274 and 270, 278 to detect read errors. Similarly, the pairs of the two lines 266, 274 and 270, 278 can be driven to the ground potential, while test patterns are run on the other pairs of the two lines 264, 272 and 268, 276 to detect read errors. This mode is implemented with no critical path overhead by specific control of the bit line clamp devices; i.e., FETs 310, 312; 330, 332; 350, 352; and 370, 372.

Detection of shorts due to manufacturing defects between bit lines from different ports which run parallel to each other over large distances (the "height" of the memory array) is difficult due to the small differential signal swing used in a high-speed read-only memory port architectures. Such faults may pass undetected during manufacturing test and result in intermittent failures in the field. A shadow write methodology may be used to sensitize the port-to-port bit line short failures during BIST or functional testing.

Shadow write for multi-port read-only architectures is used to sensitize the bit line short faults while running standard test patterns on two ports while the bit lines from the other ports are driven to the Vss potential (0 volts) by the shadow write circuitry. Since the active bit line precharge level is approximately Vdd potential (3.3 volts), any short between an active bit line and a bit line in shadow write (at 0 volts) will result in a significant error voltage being applied to the active bit line and an invalid read will result.

In normal read mode, the FETs 310 and 312 are on to limit the voltage swing on the bit lines to less than 500 mV. When shadow write mode is enabled two read-port bit line pairs are driven to the Vss potential by the FETs 316 and 318 and the FETs 354 and 356 (or the FETs 334 and 336 and the FETs 374 and 376) while test patterns are run on the other two bit line pairs to detect read errors. The shadow write a/c signal on the shadow write line 390 and the shadow write b/d signal on the shadow write line 392 select the columns on which shadow write is to be enabled.

In this example, two shadow write control signals are added to the memory control; one to enable shadow write mode and the other to select between the shadow write a/c and shadow write b/d signals. No other circuitry is required.

The latch 210 stores data "zero" or "one". When the word line read signal wlra on the line 256 is "high", the FETs 218 and 214 are gated. In a case of the "zero" data, the FETs 220 and 218 become on and the bit line 264 is pulled-do wvn by the on FETs 220 and 218, with the result that the read bit line signal blra becomes "low". The FETs 216 and 214 are off and the read bit line signal blrna on the line 272 is "high". Hence, data "zero" is read.

In a case of the "one" data, the FETs 216 and 214 become on and the bit line 272 is pulled-down by the on FETs 216 and 214, with the result that the read bit line signal blrna becomes "low". The FETs 220 and 218 are off and the read bit line signal blra on the line 264 is "high". Hence, data "one" is read.

When the shadow write a/c signal on the shadow write line 390 is "low" and the shadow write b/d signal on the shadow write line 392 is "high", the FETs 334 and 336 of the second circuit and the FETs 374 and 376 of the fourth circuit are on and the pairs of the two read-port bit lines 266, 274 and 270, 278 are driven to the ground potential, via the on-FETs. Hence, the data read through the bit lines 266, 274 of port b and 270, 278 of port d is ceased. At the same time, the FETs 310 and 312 of the first circuit and the FETs 350 and 352 of the third circuit are on and the pairs of the two read-port bit lines 264, 272 and 268, 276 are enabled. Hence, test patterns are run on the pairs of the two bit lines 264, 272 and 268, 276 to detect read errors, while the other bit lines of ports b and d is prevented from being tested. The test patterns run on the bit line pair is read via the FETs 320, 322 and 358, 360 to the pair of the bus lines 324, 326 and 362, 364, while the a-port and c-port column access signals yia and yic are "low".

Similarly, when the shadow write a/c signal on the shadow write line 390 is "high" and the shadow write b/d signal on the shadow write line 392 is "low", the on-FETs 316 and 318 of the first circuit and the FETs 354 and 356 of the third circuit, the pairs of the two read-port bit lines 264, 272 and 268, 276 are driven to the ground potential. Test patterns are run on the pairs of the two bit lines 266, 274 and 270, 278 to detect read errors. The test patterns run on the bit line pair are read via the on-FETs 338, 340 and 378, 380 to the pair of bus lines 342, 344 and 382, 384, while the column access signals yib and yid are "low".

II. Shadow Write Application to Differential Binary Data with Differential Read-Only Ports A multi-port RAM according to one embodiment of the present invention comprises RAM cells of m rows by n columns, each RAM cell including storage means for storing differential binary data. Write and read bit line signals are fully differential.

II-1. Structure

Figure 5:
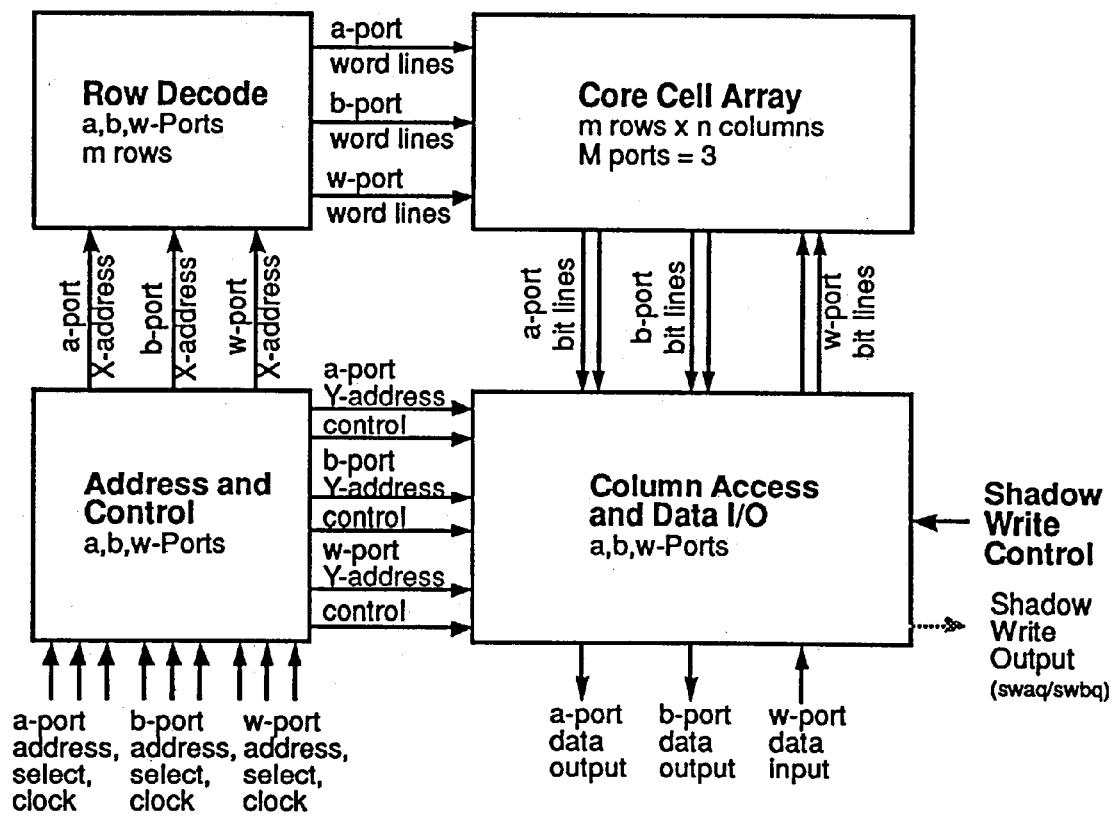
FIG. 5 is a block diagram of a 3-port RAM with one write port and two read ports according to an embodiment of the present invention.

FIG. 5 shows a block diagram of a 3-port RAM with one write-only port and two read-only ports. The RAM includes a core cell array, a row decode block, a column access and data I/O block and an address and control block. The core cell array consists of an array of m rows by n columns of the cells shown in the box of FIG. 6. Each cell has three ports (M=3 in this example); each port having a word line and bit lines. Cell access is achieved through the selection of a word line signal generated by the row decode block based on the X-address signals and the selection of a bit line pair by the column access block based on the Y-address signals.

The memory interface for an asynchronous RAM implementation with dedicated read-only and write-only ports typically includes an address bus, a memory select input and a data input bus or a data output bus per port. A synchronous implementation typically also includes clock inputs for each port. For this example, a synchronous implementation is assumed with the full interface above plus a shadow write control interface as shown in FIG. 5. For this case, the address and control block would typically include clock buffers, interface registers for all inputs and circuitry to enable or disable a memory access based on the state of the select input Deselection of the memory would typically entail disabling of the row and column decode functions and possibly disabling internal clocks to help reduce power consumption. The column access and data I/O block would typically include the column access and decode functions, data input registers, data write drivers and data output sense and buffer circuits.

Figure 6:
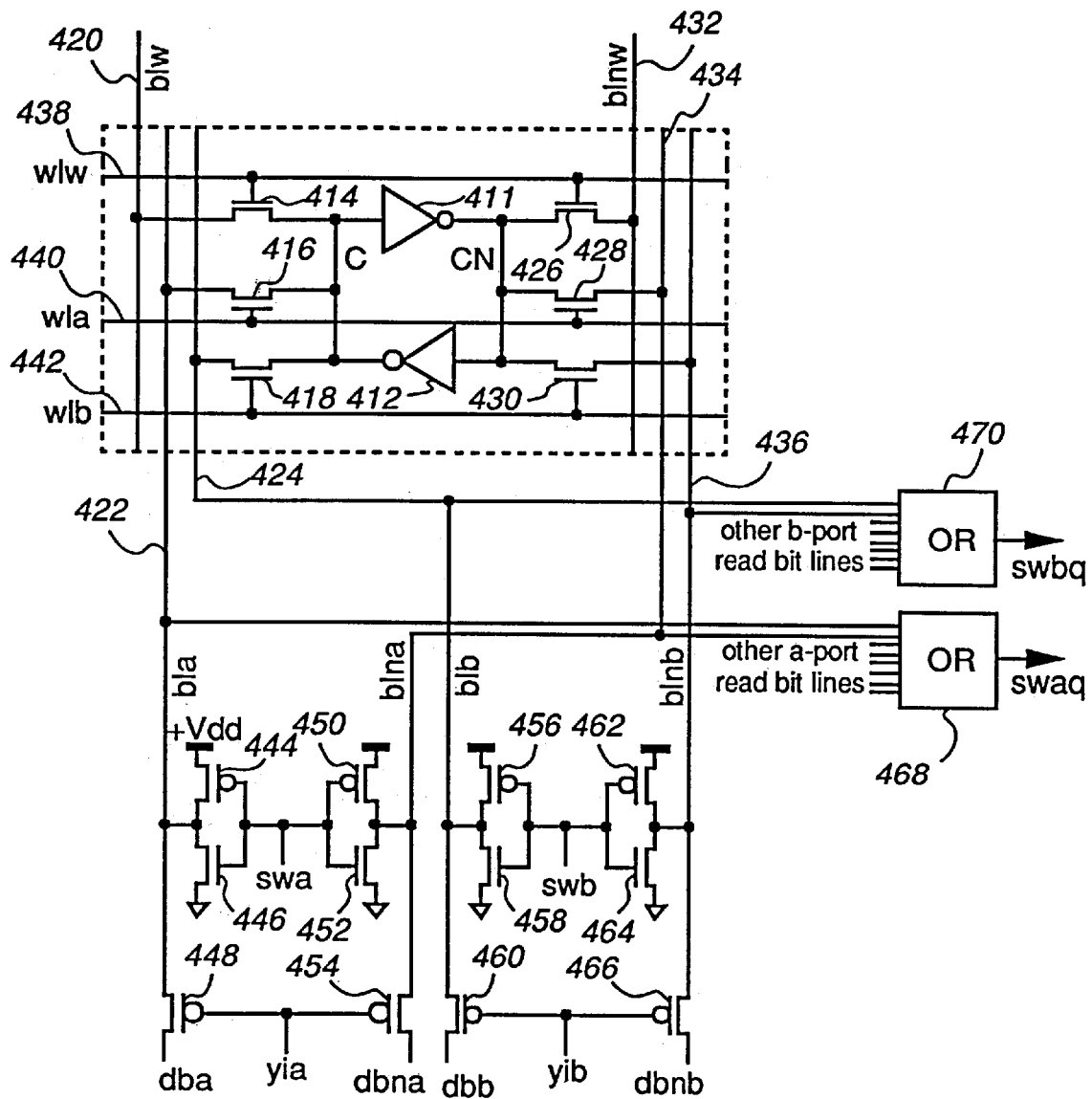
FIG. 6 is a circuit diagram of an embodiment of a RAM cell of a multi-port RAM with column select means according to the present invention.

The RAM cell shown in FIG. 6 has a 3-port storage element and includes one write port and two read ports with direct data access. The RAM cell has a data latch for storing differential binary data. The latch includes two inverters 411 and 412 connected to nodes C and CN thereof. A detail of the latch is shown in FIG. 3.

Node C of the latch is connected to the sources of N-channel FETs 414, 416 and 418. The drain of the FET 414 is connected to a line 420 on which a write bit line signal blw is present. The drains of the FETs 416 and 418 are connected to lines 422 and 424, respectively, on which a-port and b-port read bit line signals bla and blb are present. Node CN of the latch is connected to the drains of N-channel FETs 426, 428 and 430. The source of the FET 426 is connected to a line 432 on which a write bit line signal blnw is present. The sources of the FETs 428 and 430 are connected to lines 434 and 436, respectively, on which a-port and b-port read bit line signals blna and blnb are present. The gates of the FETs 414 and 426 are connected to a line 438 on which a write word line signal wlw is present. The gates FETs 416 and 428 are connected to a line 440 on which an a-port read word line signal wla is present. The gates of the FETs 418 and 430 are connected to a line 442 on which a b-port read word line signal wlb is present. The lines 420 and 432, the lines 422 and 434 and the lines 424 and 436 are pairs of differential bit lines. The write bit line signals blw and blnw, the a-port read bit line signals bla and blna, and the b-port read bit line signals blb and blnb are differential.

The line 422 is connected to the drains of a P-channel FET 444, an N-channel FET 446 and a P-channel FET 448. The line 434 is connected to the drains of a P-channel FET 450, an N-channel FET 452 and a P-channel FET 454. An a-port shadow write enable signal swa is fed to the gates of the FETs 444, 446, 450 and 452. An a-port column access signal yia is fed to the gates of the FETs 448 and 454. The line 424 is connected to the drains of a P-channel FET 456, an N-channel FET 458 and a P-channel FET 460. The line 436 is connected to the drains of a P-channel FET 462, an N-channel FET 464 and a P-channel FET 466. A b-port shadow write enable signal swb is fed to the gates of the FETs 456, 458, 462 and 464. A b-port column access signal yib is fed to the gates of the FETs 460 and 466. The sources of the FETs 444, 450, 456 and 462 are connected to the voltage supply terminal of a positive voltage +Vdd. The sources of the FETs 446, 452, 458 and 464 are connected to the ground terminal. The sources of the FETs 448, 454, 460 and 466 are connected to respective data bus lines. A-port differential read data signals dba and dbna are provided from the sources of the FETs 448 and 454, respectively. B-port differential read data signals dbb and dbnb are provided from the sources of the FETs 460 and 466, respectively. The FETs 444, 450, 456 and 462 are bit line clamp devices. The FETs 446, 452, 458 and 464 are shadow write drivers. The FETs 448, 454, 460 and 466 are column access devices. The lines 422 and 434 and other a-port read bit lines are connected to an OR circuit 468. The lines 424 and 436 and other b-port read bit lines are connected to an OR circuit 470.

II-2. Operation

To enable shadow write on the a-port, the a-port shadow write enable signal swa is set to "high". To enable shadow write on the b-port, the b-port shadow write enable signal swb is set to "high". Shadow write is disabled (normal mission mode is enabled) when both the a-port and b-port shadow write enable signals swa and swb are "low". When the shadow write is enabled on the a-port, the lines 422 and 434 are driven to the ground potential, so that a and b port-to-port bit read line shorts are sensitized.

With the direct read access used in the RAM cell, all a-port read word line signals must be disabled (held "low") while the a-port is in shadow write mode to avoid corruption of the memory contents resulting from a write-like operation from the "low" read bit line signals bla and blna when the a-port read word line signal wla is "high". This may be achieved by deselection of the a-port if a per-port memory selection capability is available. Otherwise, a shadow write-controlled row decoder deselection must be added to the memory control logic.

Port-to-port word line shorts are sensitized by driving all word line signals "low" on ports in shadow write. Any word line short between the line 440 (on which the a-port read word line signal wla is held "low") and the line 442 (on which the b-port read word line signal wlb is active) will result in corruption of cells accessed by the a-port read word line signal wla (invalid write since the a-port read bit line signals bla and blna are "low" with the a-port read word line signal wla active due to the short). Invalid reads from cells accessed by the b-port read word line signal wlb will result from read access delay faults due to the reduced voltage of the b-port read word line signal wlb resulting from the a-port to b-port read word line short. At speed testing which is rarely achievable or preferably self-timed memory operation are required to detect the delay fault induced read errors.

Shadow write control may be added to each individual read port with independent control of each circuit or grouped control (as with the 9-port TSI SRAM) if some port interactions are physically impossible.

Manufacturing test coverage of the shadow write circuitry may be achieved by performing a logical OR of all read bit line signals controlled by a given shadow write enable signal as shown in FIG. 6. In this case, all a-port read bit line signals bla and blna are logically ORed by the OR circuit 468 since they all share a common shadow write enable signal swa. Similarly, all b-port read bit line signals blb and blnb are logically ORed by the OR circuit 470. In mission mode (when shadow write is not enabled) the output of the OR circuit 468 (a-port test result signal swaq) will be "high" since the active precharge level on all read bit lines is "high". When shadow write is enabled all read bit lines are pulled "low" and the a-port test result signal swaq goes "low". If any of the shadow write drivers (FETs 446 and 452) are faulty, a read bit line signal will remain "high" and the a-port test result signal swaq will also remain "high". A fully static implementation of the logical OR is required to ensure all bit lines are "low" during shadow write and care must be taken to minimize the possibility of undetectable faults in the implementation of the circuit. Such a large distributed, static logic function will be quite slow. This is acceptable since the test algorithm will require many cycles to complete at which time the status of the bit line OR output (swaq or swbq) may be verified to determine the validity of the test.

Figure 7:
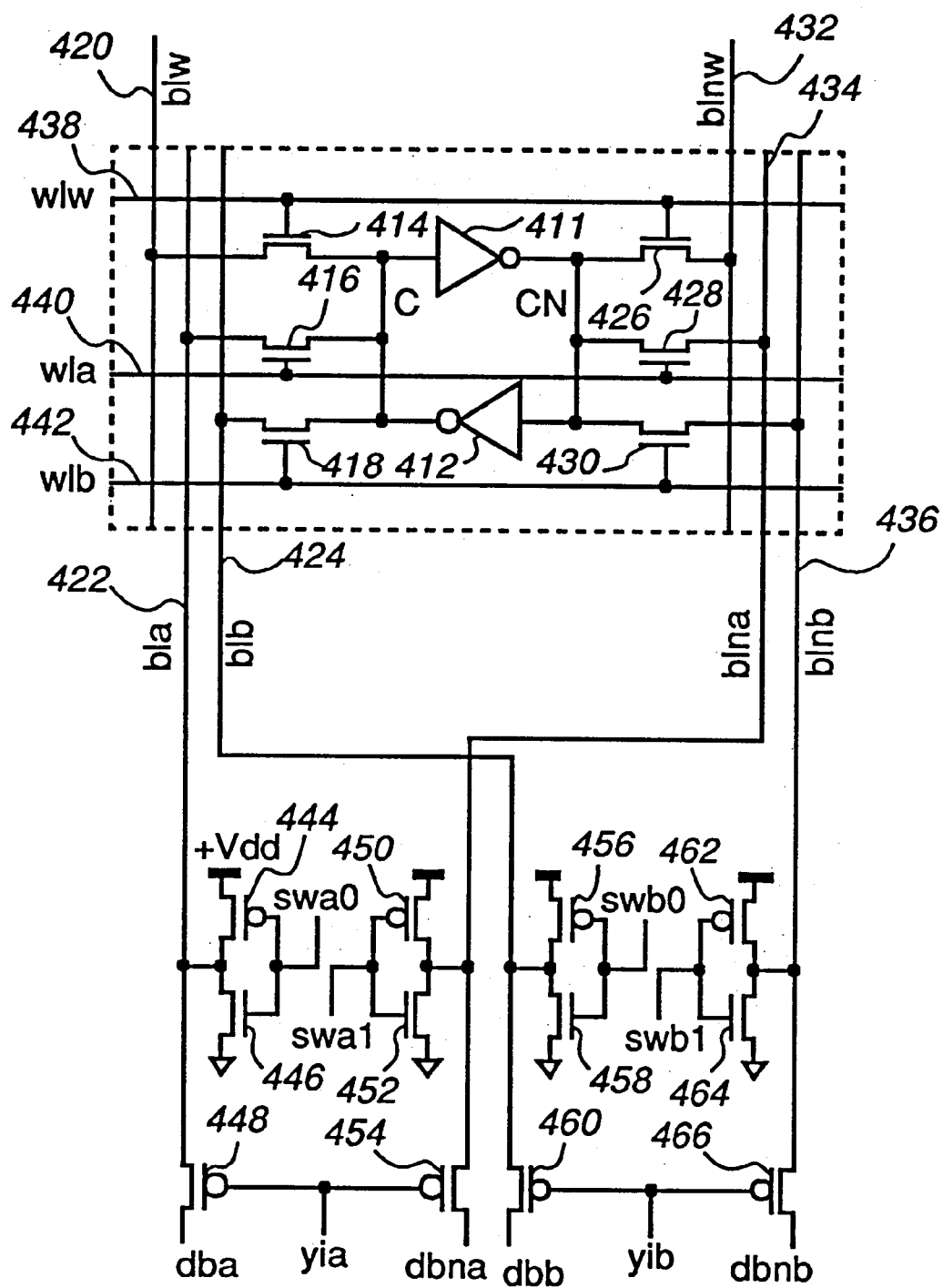
FIG. 7 is a circuit diagram of another embodiment of a RAM cell of a multi-port RAM with column select means.

III. Alternative Shadow Write Application to Differential Binary Data with Differential Read-Only Ports FIG. 7 shows a circuit of an alternative shadow write implementation which is modified slightly to improve manufacturing test coverage and not require the logical OR function circuits. In this case, each shadow write control signal is divided in two to give, for example, a-port shadow write enable signals swa0 and swa1. Full shadow write mode is enabled on the a-port when both the a-port shadow write enable signals swa0 and swa1 are "high". Mission mode is enabled on the a-port when the a-port shadow write enable signals swa0 and swa1 are both "low". Manufacturing test of the FETs 446 and 452 is enabled when either of the a-port shadow write enable signals swa0 and swa1 is "high". The b-port shadow write and the test of the Sport shadow write drivers are made in a similar manner.

The manufacturing test algorithm for detecting shadow write defects is to:

1) With shadow write disabled on all ports (both shadow write enable signals for each port are "low"), write "1" data to even rows of the memory and "0" data to odd rows of the memory; only 2×N rows must be written where N is the number of memory ports [N×MUX cycles];

2) Enable the a-port shadow write enable signal swa0 to drive the a-port read bit line signal bla "low" on all memory columns [1 cycle];

3) Enable the a-port read word line signal wla0 (on the a-port word line on row 0); if the shadow write driver device on the a-port read bit line (e.g., the FET 446 on the line 422) is functional, each a-port read bit line of the signal bla in each column of the memory will be driven "low" and all cells on row 0 will be written from state "1" which they were initialized to in step 1) to state "0" [1 cycle];

4) Disable the a-port shadow write enable signal swa0 and enable the a-port shadow write enable signal swa1 to drive the a-port read bit line signal blna "low" on all memory columns [1 cycle];

5) Enable the a-port read word line signal wla1 for row 1; all cells on row 1 will be written from the "0" state initialized in step 1) to state "1" if the shadow write driver device on the a-port read bit line (e.g., the FET 452 on the line 434) is functional [1 cycle];

6) Repeat steps 2) through 5) for each port, enabling the appropriate shadow write control signals and incrementing the row accessed in each case [(N−1)×4 cycles]; and 7) Complete the test by reading all memory locations which have been accessed in the above test; all even row locations should have data "0", odd row locations should have data "1"; any error indicates a fault in the shadow write circuitry [n×MUX cycles].

This algorithm requires N×(4+2×MUX) cycles where N is the number of ports and MUX is the column decode multiplex factor (MUX=c/d where c is the number of columns and d is the data word width). With N less than 10 and MUX typically between 1 and 32, the worst case test impact is less than 1000 cycles.

For the shadow write function to sensitize port-to-port bit line shorts, all word lines on the a port in shadow write mode must be disabled. However, for the shadow write manufacturing test described in FIG. 7 to function, it must be possible to select word lines on the a port in shadow write mode. The simplest implementation of this function is to have a per-port memory select function available to the test controller (BIST or functional tester), allowing all ports except the port under test to be disabled. The shadow write control circuitry is then completely independent of the mission mode memory control. Alternatively, shadow write control circuitry may be used to disable the memory row decoders only when both shadow write control signals on the a port are enabled (e.g., the a-port shadow write enable signals swa0 and swa1 are both "high"). The new shadow write control will require inputs to enable shadow write on each port (or port group) independently plus the split control of the shadow write control signals (the a-port shadow write enable signals swa0 and swa1) on each port or port group.

The primary advantage of the circuit is the overall simplification of the manufacturing test algorithm. By application of the shadow write circuitry shown in FIG. 7, the highly complex and configuration dependant test algorithms may be replaced by the simple SMARCH [see B. Nadeau-Dostie et al entitled "Serial Interfacing for Embedded-Memory Testing", IEEE Design & Test of Computers, April 1990, pp. 52–63] or non-serial MARCH algorithms. Each port is tested independently, as if they were independent memories, with all other ports in shadow write mode. All port-to-port bit line and word line faults are thus detected.

IV. Shadow Write Application to Differential Binary Data with Differential Read-Write Ports.

A multi-port RAM according to another embodiment of the present invention comprises RAM cells of m rows by n columns, each RAM cell including storage means for storing differential binary data. Write and read bit line signals are fully differential.

IV-1. Structure

Figure 8:
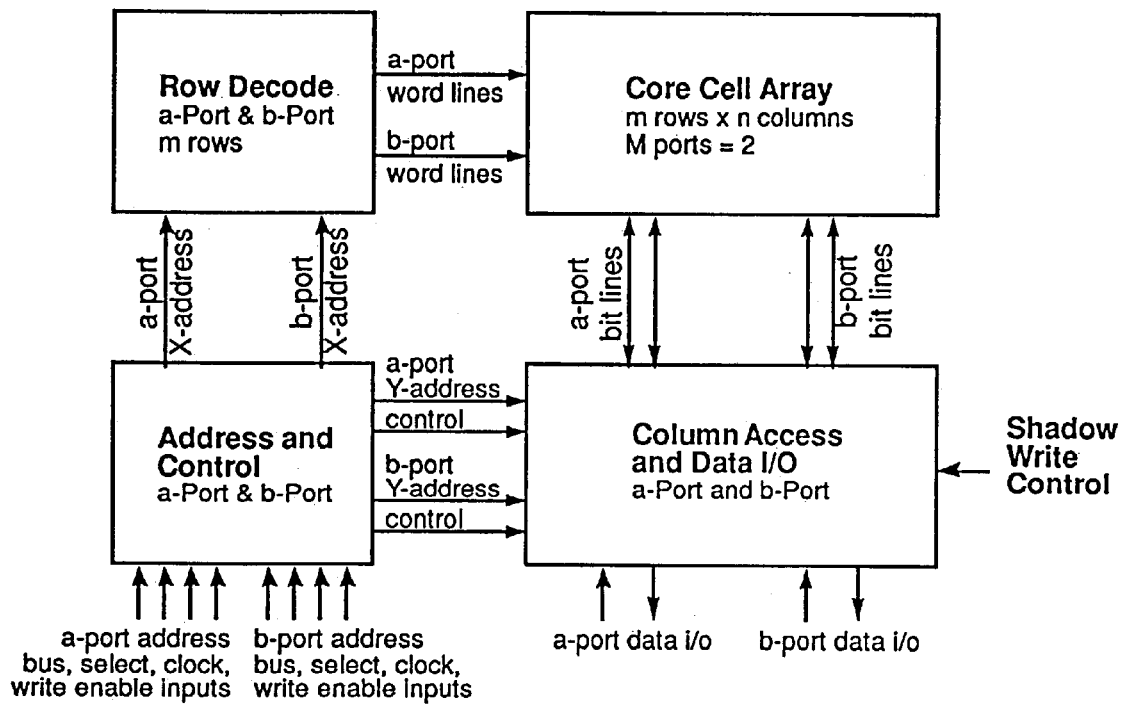
FIG. 8 is a block diagram of a two-port SRAM with two read-write ports.

FIG. 8 shows a block diagram of a 2-port RAM with two read-write ports. The RAM includes a core cell array, a row decode block, a column access and data I/O block and an address and control block. The core cell array consists of an array of m rows by n columns of the cells shown in the box of FIG. 9. Each cell has two ports (M=2 in this example); each port having word line and bit lines. Cell access is achieved through the selection of a word line signal generated by the row decode block based on the X-address signals and the selection of a bit line by the column access block based on the Y-address signals.

The memory interface for an asynchronous RAM implementation with read-write ports typically includes an address bus, a memory select input, a write (enable input, a data input bus and a data output bus per port. A synchronous implementation typically also includes clock inputs for each port. For this example, a synchronous implementation is assumed with the full interface above plus a shadow write control interface as shown in FIG. 8. For this case, the address and control block would typically include clock buffers, interface registers for all inputs, circuitry for selecting between read and write cycles depending on the state of the write enable input and circuitry to enable or disable a memory access based on the state of the select input. Deselection of the memory would typically entail disabling of the row and column decode functions and possibly disabling internal clocks to help reduce power consumption. The column access and data I/O block would typically include the column access and decode functions, data input registers, data write drivers enabled during write cycles and data output sense and buffer circuits.

Figure 9:
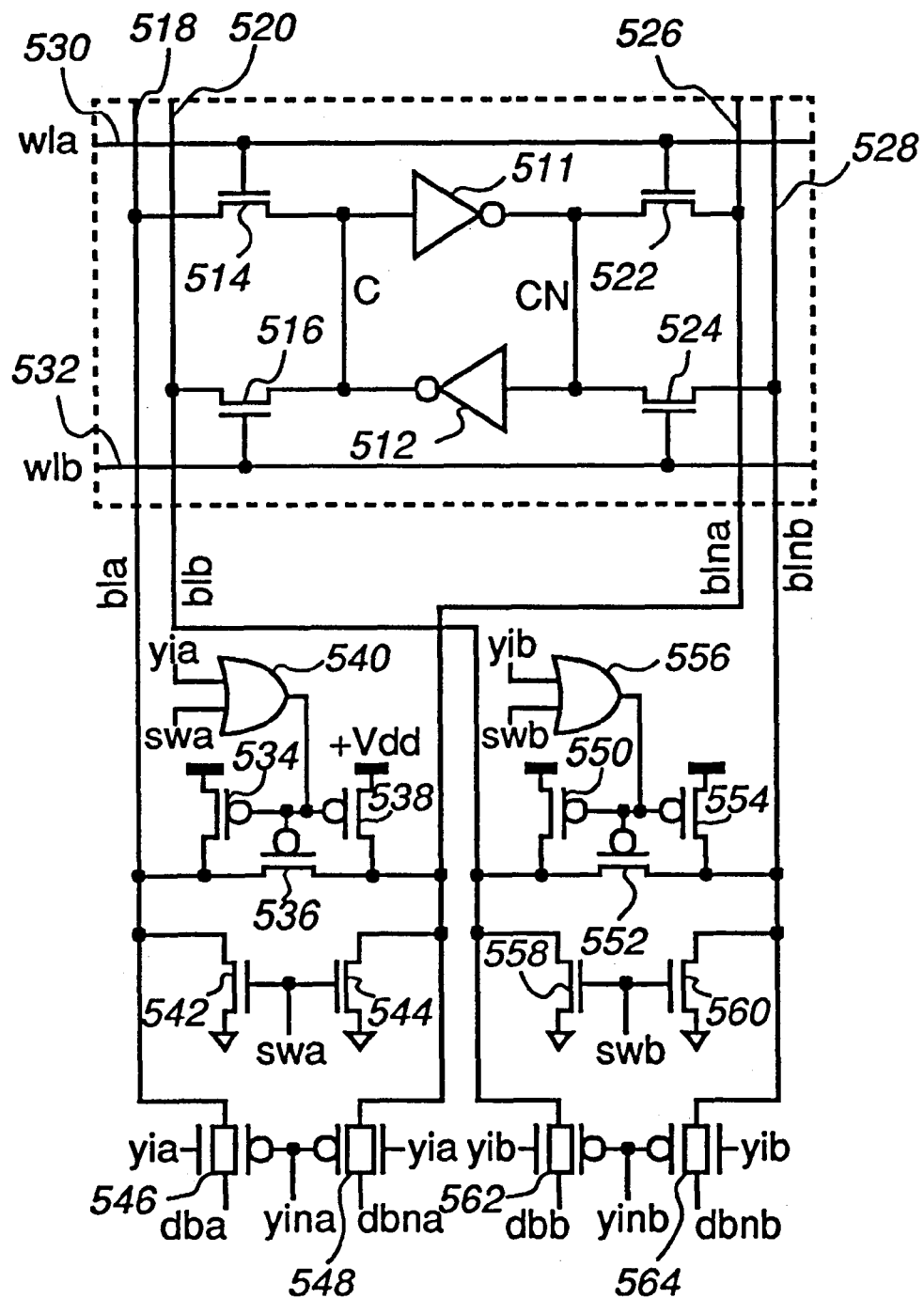
FIG. 9 is a circuit diagram of a shadow write application to differential binary data with differential read-write bit lines.

The RAM cell shown in FIG. 9 has a 2-port storage element and includes two read-write ports with direct data access. The RAM cell has a data latch which includes two inverters 511 and 512. The input of the inverter 511 and the output terminal of the inverter 512 are connected to node C of the latch. The output of the inverter 511 and the input terminal of the inverter 512 are connected to node CN of the latch. A detail of the latch is shown in FIG. 3.

Node C is connected to the sources of N-channel FETs 514 and 516, the drains of which are connected to lines 518 and 520, respectively. A-port and b-port bit line signals bla and blb are present on the lines 518 and 520, respectively. Node CN is connected to the drains of N-channel FETs 522 and 524, the sources of which are connected to lines 526 and 528, respectively. A-port and b-port bit line signals blna and blnb are present on the lines 526 and 528, respectively. The lines 518 and 526 and the lines 520 and 528 are pairs of differential bit lines. The a-port bit line signals bla and blna and the b-port bit line signals blb and blnb are pairs of differential signal.

The gates of the FETs 514 and 522 are connected to a line 530 on which an a-port word line signal wla is present. The gates of the FETs 516 and 524 are connected to a line 532 on which a b-port word line signal wlb is present.

The line 518 is connected to the drains of P-channel FETs 534 and 536. The line 526 is connected to the source of the FET 536 and the drain of a P-channel FET 538. The gates of the FETs 534, 536 and 538 are connected to the output terminal of an OR gate 540, to the input terminals of which an a-port column access signal yia and an a-port shadow write enable signal swa are fed. The lines 518 and 526 are connected to the drains of N-channel FETs 542 and 544, respectively. The a-port shadow write enable signal swa is fed to the gates of the FETs 542 and 544. The lines 518 and 526 are connected to transfer gates 546 and 548, respectively, which are connected to data bus. The a-port column access signal yia is fed to the positive input terminals of the transfer gates 546 and 548. An a-port column access signal yina is fed to the negative input terminals of the transfer gates 546 and 548.

The line 520 is connected to the drains of P-channel FETs 550 and 552. The line 528 is connected to the source of the FET 552 and the drain of a P-channel IE ET 554. The gates of the FETs 550, 552 and 554 are connected to the output terminal of an OR gate 556, to the input terminals of which a b-port column access signal yib and a b-port shadow write enable signal swb are fed. The lines 520 and 528 are connected to the drains of N-channel FETs 558 and 560, respectively. The b-port shadow write enable signal swb is fed to the gates of the FETs 558 and 560. The lines 520 and 528 are connected to transfer gates 562 and 564, respectively, which are connected to data bus. The b-port column access signal yib is fed to the positive input terminals of the transfer gates 562 and 564. A b-port column access signal yinb is fed to the negative input terminals of the transfer gates 562 and 564. The sources of the FETs 534, 538, 550 and 554 are connected to the voltage supply terminal of a positive voltage +Vdd. The sources of the FETs 542, 544, 558 and 560 are connected to the ground terminal. The FETs 534, 536, 538, 550, 552 and 554 are bit line precharge devices. The OR gates 540 and 556 provide a precharge disable function. The FETs 542, 544, 558 and 560 are shadow write driver devices. The transfer gates 546, 548, 562 and 564 are port column access devices.

The port column access signals yia/yina and yib/yinb are differential. When the a-port column access signals yia and yina are "high" and "low", respectively, the transfer gates 546 and 548 are on, so that the a-port data signals dba and dbna are provided via the transfer gates 546 and 548, respectively, from the data bus to the lines 518 and 526 in a write mode and from the lines 518 and 526 to the data bus in a read mode. Similarly, when the b-port column access signals yib and yinb are "high" and "low", respectively, the transfer gates 562 and 564 are on, so that the b-port data signals dbb and dbnb are provided from the data bus to the lines 520 and 528 in the write mode and from the lines 520 and 528 to the data bus in the read mode. The a-port data signals dba and dbna and the b-port data signals dbb and dbnb are differential.

IV-2. Operation

To enable shadow write on the a-port, the a-port shadow write enable signal swa is set to "high". To enable shadow write on the b-port, the b-port shadow write enable signal swb is set to "high". Shadow write is disabled (normal mission mode is enabled) when both the a-port and b-port shadow write enable signals swa and swb are "low". With shadow write enabled on the a-port, precharge is disabled and the a-port bit line signals bla and blna are driven to the ground potential to sensitize a and b port-to-port bit line shorts.

With the direct access used in the RAM cell, all word line signals on a port in shadow write mode must be disabled (held "low") to avoid corruption of the memory contents resulting from a write-like operation from the low bit line signals (e.g. the a-port bit line signals bla and blna) when the word line signal (e.g., the a-port word line signal wla) is "high". This may be achieved by deselection of the port in shadow write if a per-port memory selection capability is available. Otherwise, a shadow write-controlled row decoder deselection must be added to the memory control logic.

Port-to-port word line shorts are sensitized by driving all word line signals "low" on ports in shadow write. Any word line short between the line 530 and the line 532 will result in corruption of cells accessed by the a-port word line signal wla (invalid write since the a-port and b-port bit line signals bla and blna are both "low" with the a-port word line signal wla active due to the short). Invalid reads from cells accessed by the b-port word line signal wlb will result from read access delay faults due to the reduced voltage of the b-port word line signal wlb resulting from the a-port to b-port word line short. At speed testing or self-timed memory operation are required to detect the delay fault induced read errors.

Shadow write control may be added to each individual read port with independent control of each circuit or grouped control (as with the 9-port TSI SRAM) if some port interactions are physically impossible.

Manufacturing test of the shadow write function may be achieved by the logical OR function similar to FIG. 6 or, with a slight modification to the implementation if FIG. 9 to make it more closely resemble the shadow write function of FIG. 7, through the test pattern described in relation to FIG. 7. This will be described later (Section V.)

The performance impact for this implementation is slightly greater than that for the shadow write implementations described in relation to FIGS. 4, 6 and 7. In this case, the critical path interaction is limited to the shadow write drivers (the FETs 542, 544, 558 and 560) and the bit line precharge disable OR function circuits (the OR gates 540 and 556) and the precharge devices (the FETs 534, 536, 538, 550, 552 and 554).

Figure 10:
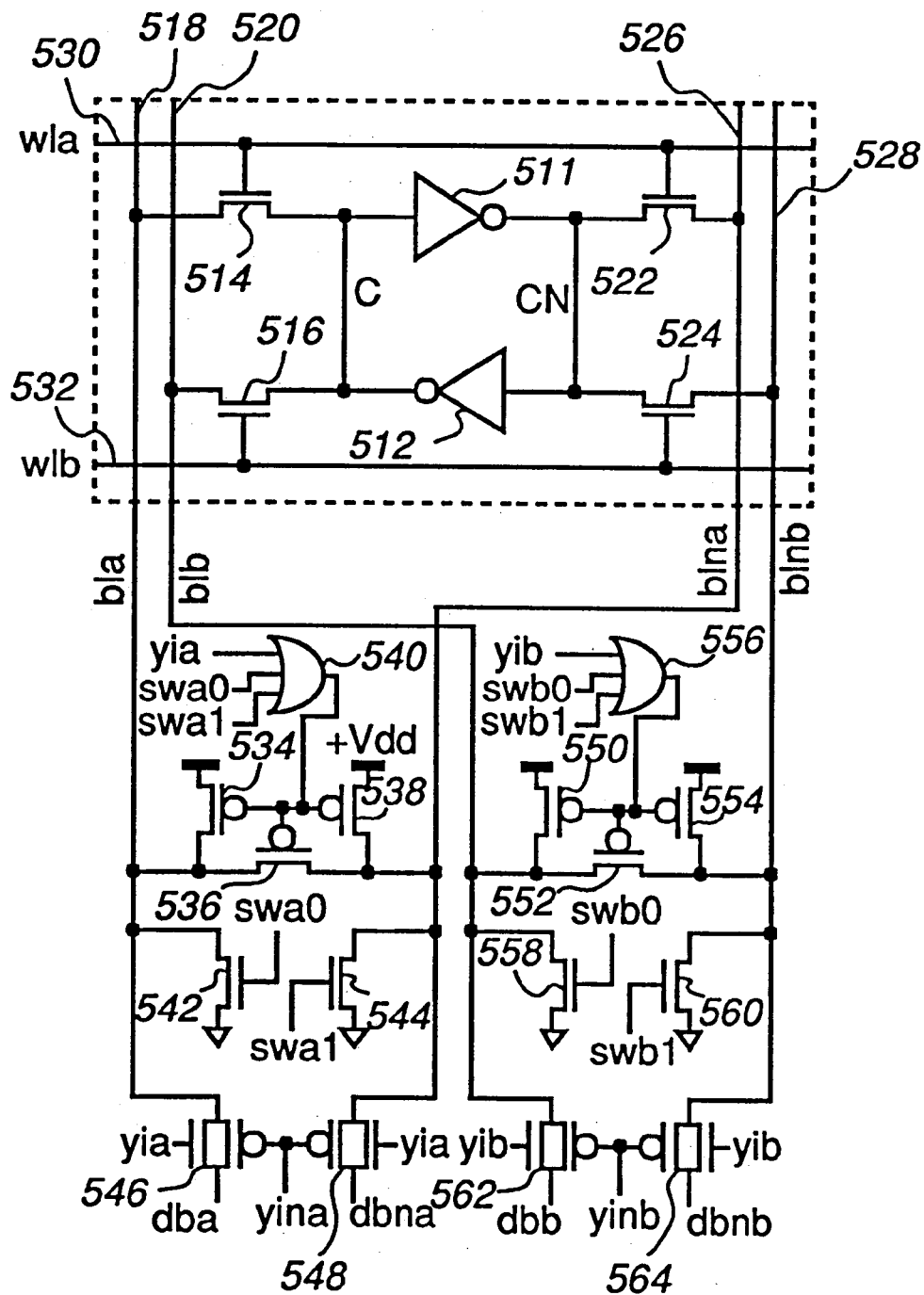
FIG. 10 is another circuit diagram of a shadow write application to differential binary data with single-ended read-write bit lines.

V. Alternative Shadow Write Application to Differential Binary Data with Differential Read-Write Ports FIG. 10 shows a circuit of an alternative shadow write implementation which is modified slightly to improve manufacturing test coverage. In this case, each shadow write control signal is divided in two to give, for example, a-port shadow write enable signals swa0 and swa1. Full shadow write mode is enabled on the a-port when both the a-port shadow write enable signals swa0 and swa1 are "high". Mission mode is enabled on the a-port when the a-port shadow write enable signals swa0 and swa1 are both "low". Manufacturing test of the FETs 542 and 544 is enabled when either of the a-port shadow write enable signals swa0 and swa1 is "high". The manufacturing test algorithm for detecting shadow write defects is identical to the one described in relation to the implementation shown in FIG. 7.

The primary advantage of this shadow write implementation is the overall simplification of the manufacturing test algorithm. By application of the shadow write circuitry shown in FIG. 9 or 10, highly complex and configuration dependant test algorithms may be replaced by the simple MARCH-type algorithms. Each port is tested independently, as if they were independent memories, with all other ports in shadow write mode. All port-to-port bit line and word line faults are thus detected. The original shadow write concept outlined in B. Nadeau-Dostie et al "Serial Interfacing for Embedded-Memory Testing" at pp. 60–61 outlines a method for using the built-in write capability of the read-write port in shadow write mode to sensitize the port-to-port faults. The advantages of the new proposal are three fold: 1) the new shadow write is global, all bit lines on the port in shadow write are driven to ground, as a result the new shadow write requires only a single pass through the test algorithm on the port under test; the original implementation requires both phases of data to be driven onto the bit lines of the port in shadow write to sensitize all port-to-port shorts; 2) the critical path interaction of the shadow write implementation is much lower than the original implementation assuming a per-port memory select is available to disable the word lines on the port in shadow write; and 3) the shadow write implementation is testable, that is, the logical OR function or shadow write test algorithm allows the shadow write function to be verified.

VI. Shadow Write Application to Single-Ended Binary Data with Single-Ended Read-Write Bit Lines A multi-port RAM according to another embodiment of the present invention comprises RAM cells of m rows by n columns, each RAM cell including storage means for storing single-ended binary data. Write and read bit line signals are single-ended.

Figure 11:
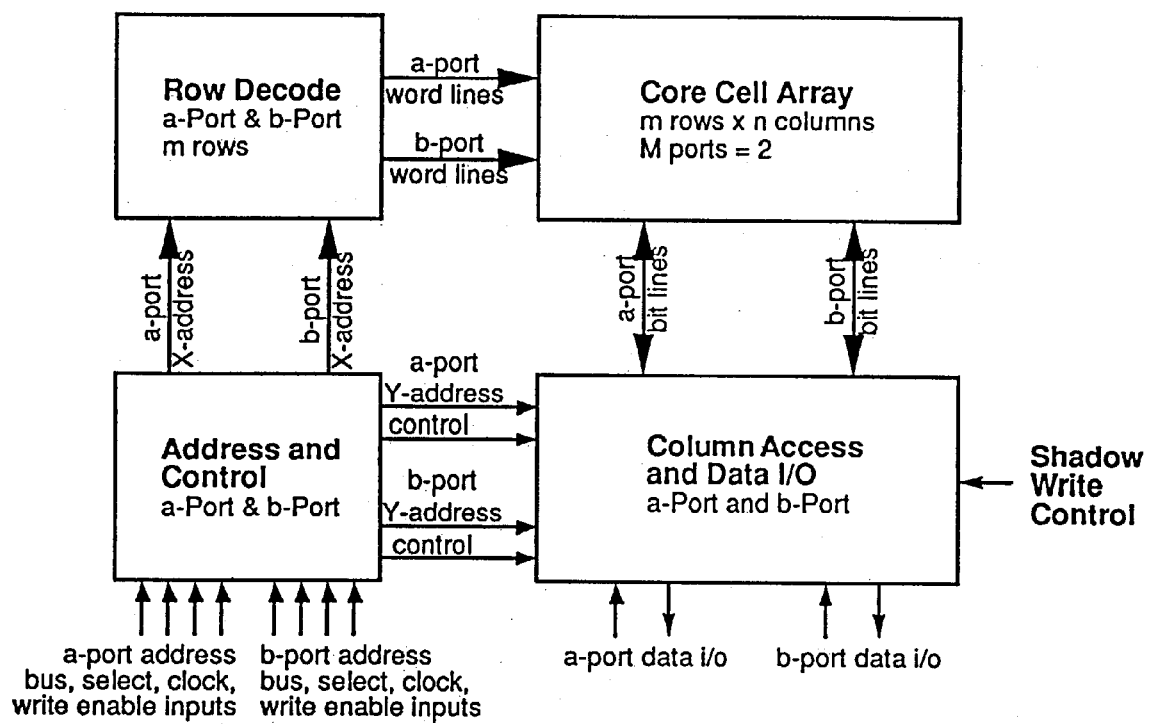
FIG. 11 is a block diagram of a two-port SRAM with two read-write ports.

FIG. 11 shows a block diagram of a 2-port RAM with two read-write ports. The RAM includes a core cell array, a row decode block, a column access and data I/O block and an address and control block. The core cell array consists of an array of m rows by n columns of the cells shown in the box of FIG. 12. Each cell has two ports (M=2 in this example); each port having a word line and a bit line. Cell access is achieved through the selection of a word line signal generated by the row decode block based on the X-address signals and the selection of a bit line by the column access block based on the Y-address signals.

The memory interface for an asynchronous RAM implementation with read-write ports typically includes an address bus, a memory select input, a write enable input, a data input bus and a data output bus per port. A synchronous implementation typically also includes clock inputs for each port. For this example, a synchronous implementation is assumed with the full interface above plus a shadow write control interface as shown in FIG. 11. For this case, the address and control block would typically include clock buffers, interface registers for all inputs, circuitry for selecting between read and write cycles depending on the state of the write enable input and circuitry to enable or disable a memory access based on the state of the select input. Deselection of the memory would typically entail disabling of the row and column decode functions and possibly disabling internal clocks to help reduce power consumption. The column access and data I/O block would typically include the column access and decode functions, data input registers, data write drivers enabled during write cycles and data output sense and buffer circuits.

VI-1. Structure

Figure 12:
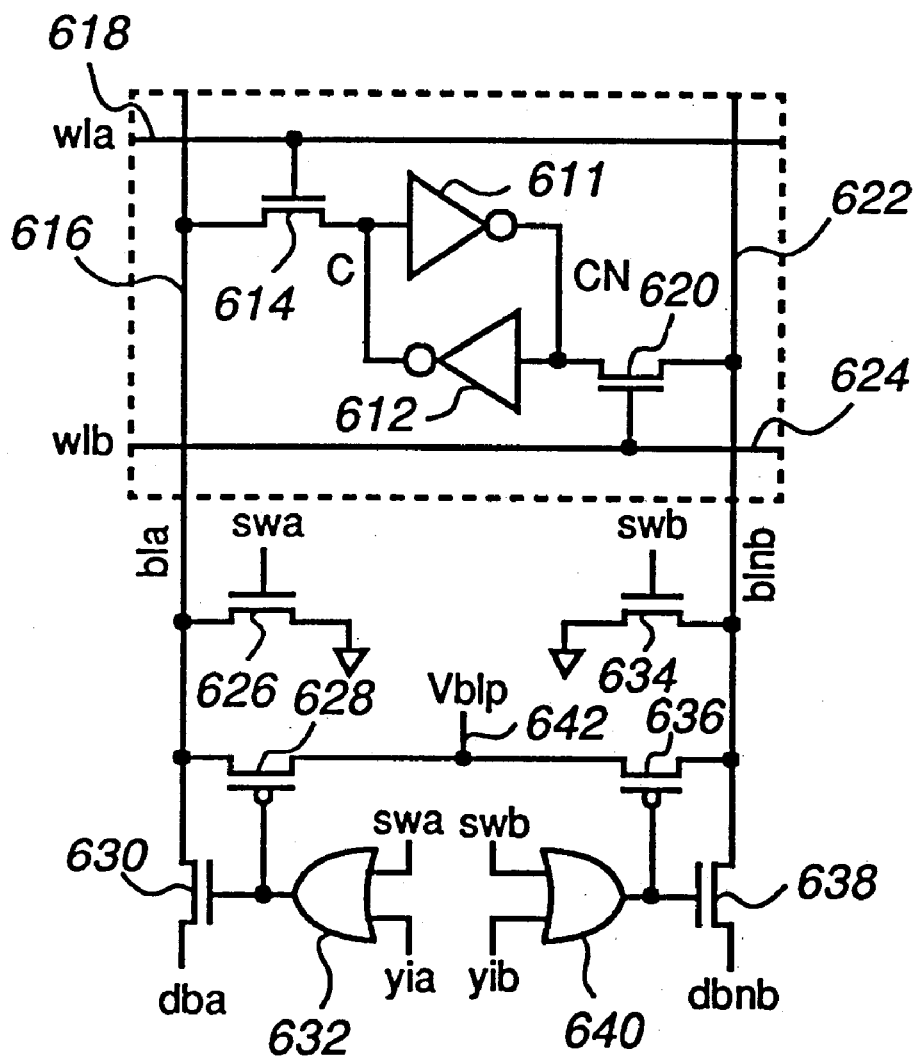
FIG. 12 is a circuit diagram of a shadow write application to single-ended binary data with single-ended read-write bit lines.

FIG. 12 shows the implementation of a shadow write circuit used in a typical 2-port SRAM implementation with single-ended read-write ports. The 2-port RAM cell shown is typical for this type of memory with the single NMOS access (word line access devices connect bit lines directly to nodes C and CN of a latch) per port. The latch includes inverters 611 and 612. A detail of the latch is shown in FIG. 3.

In FIG. 12, node C is connected to the source of an N-channel FET 614, the drain of which is connected to a line 616. An a-port bit line signal bla is present on the line 616. The gate of the FET 614 is connected to a line 618 on which an a-port word line signal wla is present. Node CN is connected to the drain of an N-channel FET 620, the source of which is connected to a line 622. A b-port bit line signal blnb (an inverted signal) is present on the line 622. The gate of the FET 620 is connected to a line 624 on which a b-port word line signal wlb is present. The line 616 is connected to the drains of an N-channel FET 626, a P-channel FET 628 and an N-channel FET 630. The gates of the FETs 628 and 630 are connected to the output terminal of an OR gate 632 to which an a-port shadow write enable signal swa and an a-port column select signal yia are fed. The line 622 is connected to the drains of an N-channel FET 634, a P-channel FET 636 and an N-channel FET 638. A-port and b-port shadow write enable signals swa and swb are fed to the gates of the FETs 626 and 634, respectively. The gates of the FETs 636 and 638 are connected to the output terminal of an OR gate 640 to which a b-port shadow write enable signal swb and a b-port column select signal yib are fed. The sources of the FETs 630 and 638 are connected to data bus. The sources of the FETs 626 and 634 are connected to the ground terminal. The sources of the FETs 628 and 636 are connected to a precharge line 642.

The FETs 626 and 634 are shadow write driver devices. The FETs 628 and 636 are bit line precharge devices. The FETs 630 and 638 are column access devices.

VI-2. Operation

Normal read or write operations (mission mode read or write) are performed when shadow write mode is disabled; i.e., both the a-port and b-port shadow write enable signals swa and swb are "low". A read cycle is performed by initiating an access with the bit line signal (e.g., bla) at the precharge voltage potential Vblp, as defined by the active FETs 628 and 636, since both a-port shadow write enable signal swa and a-port column select signal yia are "low". A voltage generator for the precharge voltage potential is not shown. The precharge voltage is defined to allow cell access without over writing the cell contents—typically around Vdd/2. Cell selection is made by activating the word line signal wla and the column select line signal yia. This disables the bit line precharge and allows the cell to drive the bit line signal to either a "high" or "low" state. The column access device (the FET 630 or 638) then passes the read data to the data output via the data bus, so that an a-port data signal dba or a b-port data signal dbb is provided. Following the completion of the access, the word line and column access are disabled and bit line precharge is enabled to prepare for the next access. A write cycle is similar, with data forced on to the bit line via the column access device (the FET 630 or 638) while the cell is selected. Forcing the bit line signal (e.g., the a-port bit line signal bla) "high" or "low" while the word line signal (e.g., the a-port word line signal wla) is active will over write the cell contents.

Shadow write is enabled on a port by setting the corresponding shadow write enable signal swa or swb "high". With shadow write enabled on the a-port, the a-port bit line signal bla is driven "low" by the gated shadow write driver FET 626. Bit line shorts between ports with shadow write mode enabled (e.g., a-port) and ports under test (e.g., b-port) are sensitized. If "high" data is expected on the line 622 (the port under test) of the b-port bit line signal blnb and a short exists to the a-port bit line 616 (the port in shadow write) of the a-port bit line signal bla, then the voltage driven on the a-port bit line 616 by the shadow write driver FET 626 will result in an invalid read on the line 622 which will also be pulled "low".

With the direct access used in the RAM cell, all word line signals on ports in shadow write must be disabled (held "low") to avoid corruption of the memory contents resulting from a write-like operation from the "low" bit line in shadow write (e.g., the line 618 of the a-port bit line signal bla) if a word line signal (e.g., the a-port word line signal wla) is "high". This may be achieved by deselection of the port in shadow write if a per-port memory selection capability is available as shown in FIG. 11. Otherwise, a shadow write-controlled row decoder deselection must be added to the memory control logic.

Port-to-port word line shorts are sensitized by driving all word line signals wla and wlb "low" on ports in shadow write. Any word line short between the line 618 (on which the a-port word line signal wla is held "low") and the line 624 (on which the b-port word line signal wlb is active) will result in corruption of cells accessed by wla (write of "zero" since the a-port bit line signal bla is "low" with the a-port word line signal wla active due to the short). Invalid reads from cells accessed by the b-port word line signal wlb will result from read access delay faults due to the reduced voltage of the signal wlb resulting from the lines 618 to 624 short. At speed testing or self-timed memory operation are required to detect the delay fault induced read errors.

Shadow write control may be added to each individual read port with independent control of each circuit or grouped control if some port interactions are physically impossible. The selection of shadow write source potential (the voltage to which the shadow write drivers force the bit lines in shadow write) need not be ground as in this case. Any known potential which will sensitize the faults will suffice. For example, Vdd potential applied to the bit lines in shadow write by the shadow write drivers could have been used in this example.

Figure 13:
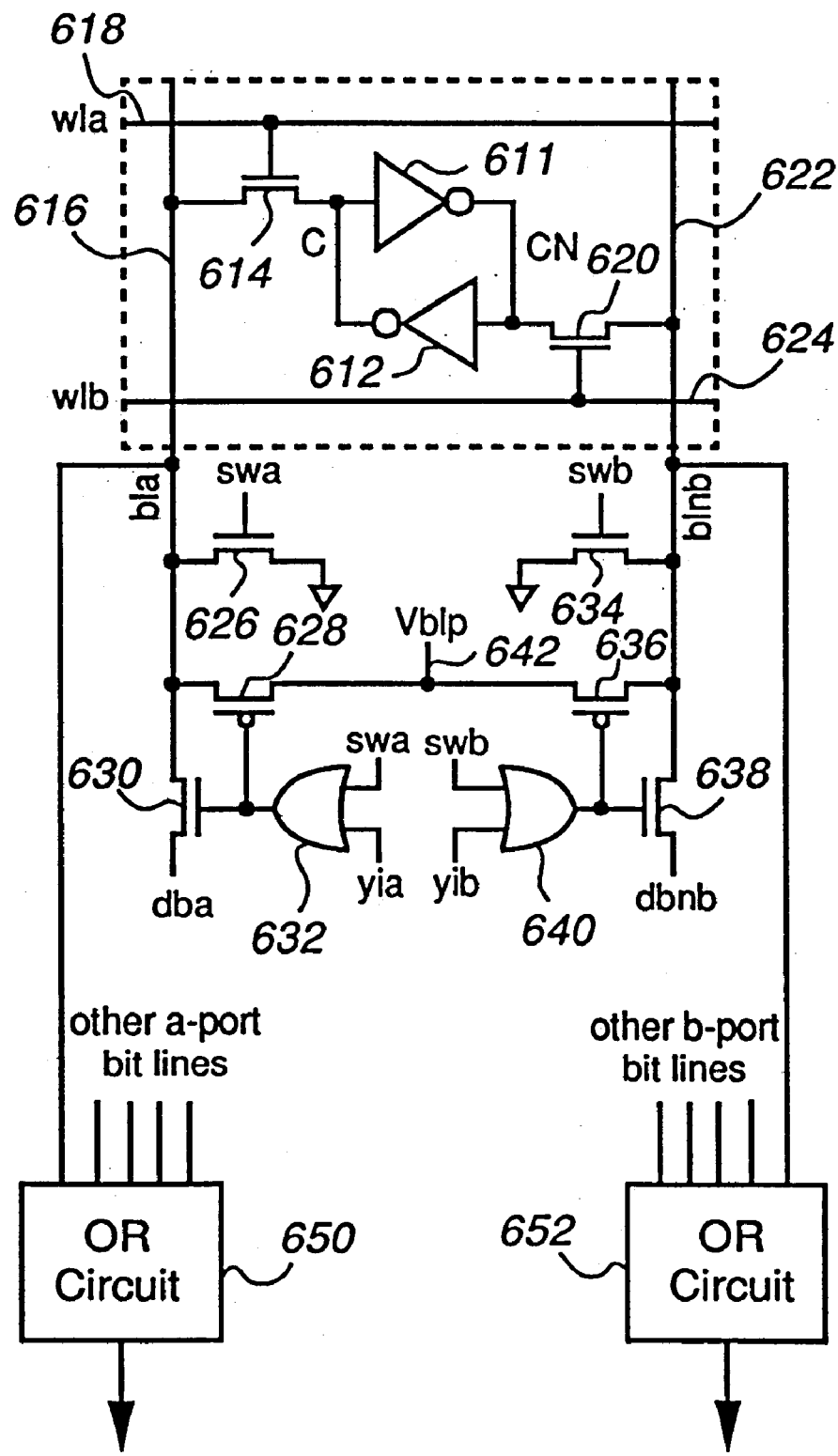
FIG. 13 is a circuit diagram of another shadow write application to single-ended binary data with single-ended read-write bit lines.

Manufacturing test coverage of the shadow write circuitry may be achieved by observation of data read from the port in shadow write mode. Since all bit line signals on a port in shadow write are driven "low", the expected data on the data outputs will all be "low" (in the case where bit line polarity is the same as the data output polarity as shown in FIG. 12 for a-port). If a read of the shadow write port data is not possible, logical OR test function circuits of all bit lines in shadow write mode may be used, as shown in FIG. 13. In FIG. 13, the line 616 and other a-port bit lines are connected to an OR circuit 650. The line 622 and other b-port bit lines are connected to an OR circuit 652. A-port and b-port test result signals are provided by the OR circuits 650 and 652, respectively, as described in relation to FIG. 6.

The primary advantage of this shadow write implementation is the overall simplification of the manufacturing test algorithm for testing multi-port memories. By application of the shadow write circuitry shown in FIG. 12, highly complex and configuration dependent test algorithms may be replaced by simple MARCH-type algorithms. Each port is tested independently, as if they were independent single-port memories, with all other ports in shadow write mode. All port-to-port bit line and word line faults are thus detected in addition to the fault types typically detected by the selected algorithm. The only BIST circuitry overhead incurred beyond that of a standard single-port BIST is the addition of port selection circuitry, which includes the shadow write enable and port deselect functions for ports in shadow write, and shadow write manufacturing test circuitry to test the shadow write circuitry.

Figure 14:
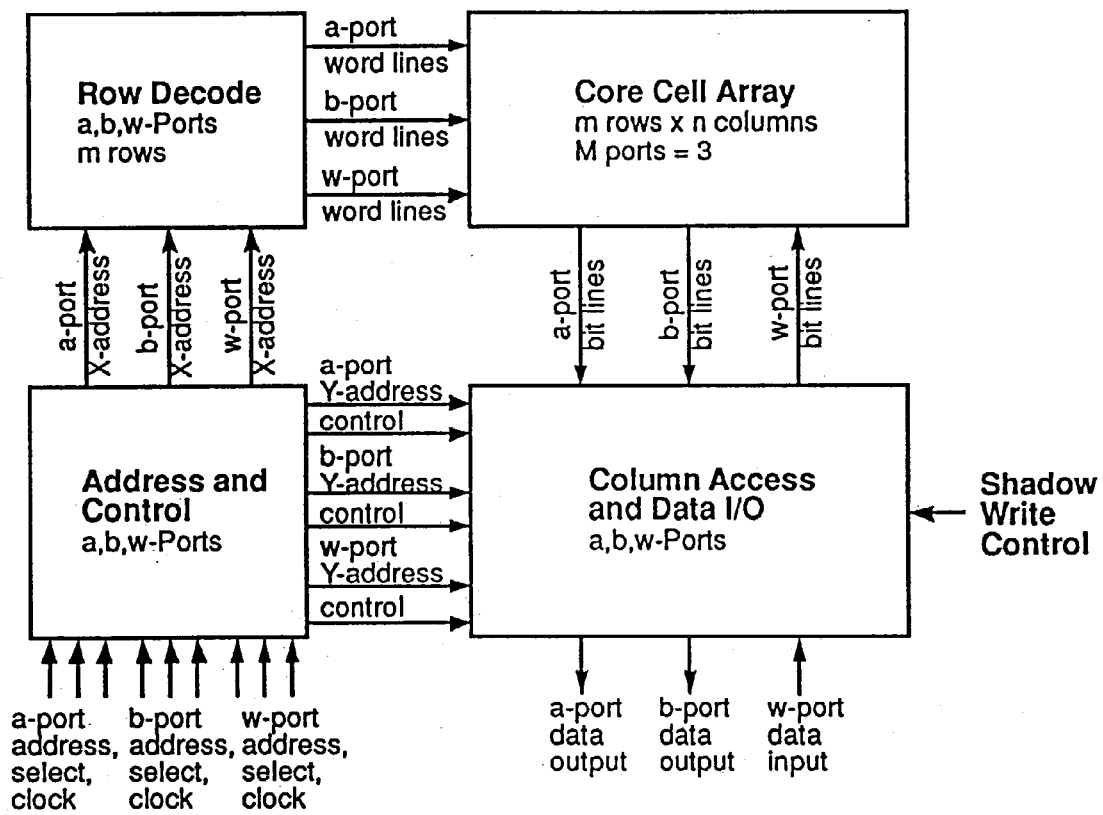
FIG. 14 is a block diagram of a 3-port SRAM with one write-only port and two read-only ports.

VII. Shadow Write Application to a 3-Port SRAM with One Single-Ended Write-Only Port and Two Single-Ended Read-Only Ports FIG. 14 shows a block diagram of a 3-port RAM with one write-only port and two read-only ports. The RAM includes a core cell array, a row decode block, a column access and data I/O block and an address and control block. The core cell array consists of an array of m rows by n columns of the cells shown in the box of FIG. 15. Each cell has three ports (M=3 in this example); each port having a word line signal (an a-port read word line signal wla, b-port read word line signal wlb or a write word line signal wlw) and a bit line signal (an a-port read bit line signal bla, a b-port read bit line signal blb or a write bit line signal blw). Cell access is achieved through the selection of a word line signal generated by the row decode block based on the X-address signals and the selection of a bit line by the column access block based on the Y-address signals.

The memory interface for an asynchronous RAM implementation with dedicated read-only and write-only ports typically includes an address bus, a memory select input and a data input bus or a data output bus per port. A synchronous implementation typically also includes clock inputs for each port. For this example, a synchronous implementation is assumed with the full interface above plus a shadow write control interface as shown in FIG. 14. For this case, the address and control block would typically include clock buffers, interface registers for all inputs and circuitry to enable or disable a memory access based on the state of the select input. Deselection of the memory would typically entail disabling of the row and column decode functions and possibly disabling internal clocks to help reduce power consumption. The column access and data I/O block would typically include the column access and decode functions, data input registers, data write drivers and data output sense and buffer circuits.

Figure 15:
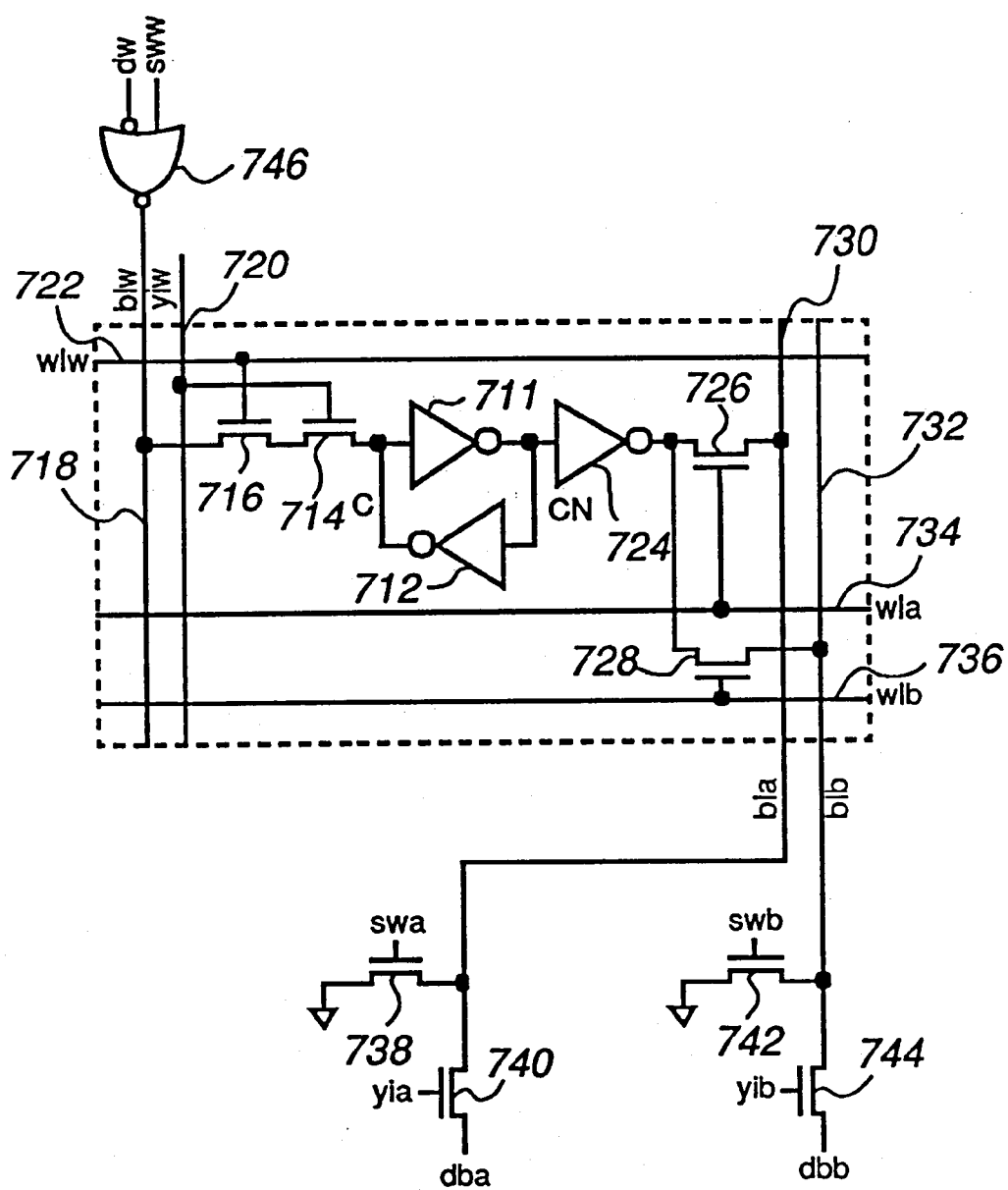
FIG. 15 is a circuit diagram of a shadow write application to a 3-port SRAM with one single-ended write-only port and two single-ended read-only ports.

FIG. 15 shows the implementation of the shadow write feature to the 3-port RAM with one single-ended write-only port and two single-ended read-only ports. The 3-port RAM cell shown is typical for this type of memory with the series NMOS write access and the buffered read-only ports (the read bit lines do not directly access node C or CN of a latch, but are buffered by an inverter). The latch includes two inverters 711 and 712 connected to nodes C and CN thereof. A detail of the latch is shown in FIG. 3.

In FIG. 15, node C is connected to the source of an N-channel FET 714, the drain of which is connected to the source of an N-channel FET 716. The drain of the FET 716 is connected to a line 718 on which a write bit line signal blw is present. The gates of the FET 714 and 716 are connected to lines 720 and 722, respectively, on which a w-port column select signal yiw and a write word line signal wlw are present. Node CN is connected to the input terminal of an inverter 724, the output terminal of which is connected to the drains of N-channel FETs 726 and 728. The sources of the FETs 726 and 728 are connected to lines 730 and 732, respectively, on which a-port and b-port read bit line signals bla and blb are present. The gates of the FETs 726 and 728 are connected to lines 734 and 736, respectively, on which a-port and b-port read word line signals wla and wlb are present. The line 730 is connected to the drains of N-channel FETs 738 and 740. The line 732 is connected to the drains of N-channel FETs 742 and 744. The output terminal of a NOR gate 746 is connected to the line 718. A w-port shadow write enable signal sww and a w-port write data input signal dw are fed to non-inverting and inverting input terminals of the NOR gate 746, respectively.

A-port and b-port shadow write enable signals swa and swb are fed to the gates of the FETs 738 and 742, respectively. A-port and b-port column select signals yia and yib are fed to the gates FETs 740 and 744, respectively. The sources of the FETs 740 and 744 are connected to data bus.

The FETs 738 and 742 are read port shadow write drivers. The FETs 740 and 744 are column access devices.

Normal read or write operations (mission mode read or write) are performed when shadow write mode is disabled; the a-port shadow write enable signal swa, the b-port shadow write enable signal swb and the w-port shadow write enable signal sww are "low". A read cycle is performed by activating a word line signal (e.g., wla) and column select line signal (e.g., yia). This allows the cell to drive the bit line to either a "high" or "low" state. The column access device then passes the read data to the data output via the data bus. An a-port read data signal dba or a b-port read data signal dbb is provided through the on FET 740 or 744. A write is achieved by driving the write data on to the write bit line signal blw while the cell is selected (the write word line signal wlw and the w-port column select signal yiw are "high"). Forcing the write bit line signal blw "high" or "low" while the write word line signal wlw and the a-port shadow column select signal yia are active will over write the cell contents.

Shadow write is enabled on a read-only port (e.g., a-port) by setting the shadow write control signal (e.g., the a-port shadow write enable signal swa) "high". With shadow write enabled on a-port, the a-port read bit line signal bla is driven "low". Bit line shorts between ports with shadow write mode e enabled (e.g., a-port) and ports under test (e.g., b-port) are sensitized. If "high" data is expected on the line 732 (the port under test) and a short exists to the line 730 (the port in shadow write) then the voltage driven on the a-port read bit line signal bla by the shadow write driver (the FET 738) will result in an invalid read on the line 732 of the b-port read bit line signal blb which will also be pulled "low".

All word lines on a port in shadow write mode must be disabled (held "low") to avoid unnecessary power consumption when a cell storing "one" data is accessed by a word line on the port in shadow write. This may be achieved by deselection of the port in shadow write mode if a per-port memory selection capability is available. Otherwise, a shadow write controlled row decoder deselection must be added to the memory control logic.

Shadow write is enabled on a write-only port (w-port) by setting the w-port shadow write enable signal sww "high". With shadow write enabled on w-port, the write bit line signal blw is driven "low" to sensitize shorts to bit lines from any other port. As with the read-only ports, the write-only port row decode should be disabled while the write port is in shadow write mode to avoid corruption of the memory cell contents. In this example, the w-port column select signals yiw should also be driven to the shadow write potential ("low") since it runs parallel to the bit lines and should therefore be tested as if it were a bit line.

By driving all word line signals "low" on ports in shadow write (either read or write ports) any word line short between ports in shadow write and the port under test will result in substantially slower read operation due to the reduced read word line drive resulting from the short. These delay faults may be detected by running at-speed or self-timed tests on the memory.

Shadow write control may be added to each individual port with independent control of each circuit or grouped control if some port interactions are physically impossible. The selection of shadow write source potential (the voltage to which the shadow write drivers force the bit lines in shadow write) need not be ground as in this case. Any known potential which will sensitize the faults will suffice. For example, Vdd potential applied to the bit lines in shadow write by PMOS shadow write drivers could have been used in this example.

Manufacturing test coverage of the read-only shadow write circuitry may be achieved by observation of data read from the read-only ports while in shadow write. Since all bit lines on a port in shadow write are driven "low" in this example, the expected data will be all "low" (in the case where bit line polarity is the same as the data output polarity). If a read of the shadow write port data is not possible, a logical OR test function circuit of all bit lines in shadow write mode may be used, as shown in FIG. 16.

Figure 16:
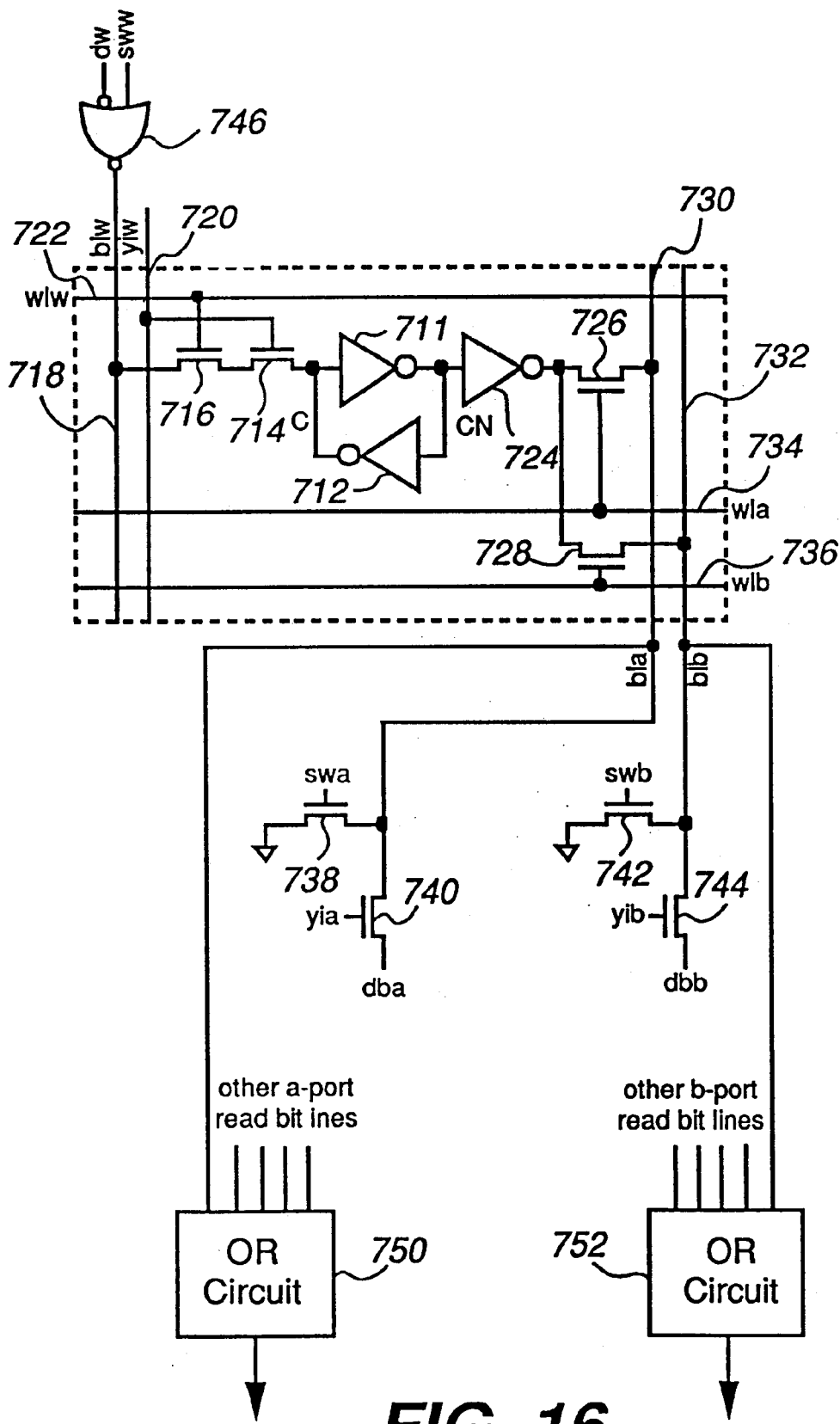
FIG. 16 is a circuit diagram of another shadow write application to a 3-port SRAM with one single-ended write-only port and two single-ended read-only ports.

In FIG. 16, the line 730 and other a-port read bit lines are connected to an OR circuit 750. The line 732 and other b-port read bit lines are connected to an OR circuit 752. A-port and b-port test result signals are provided by the OR circuits 750 and 752, respectively, as described in relation to FIG. 6.

The primary advantage of this shadow write invention is the overall simplification of the manufacturing test algorithm for testing multi-port memories. By application of the shadow write circuitry shown in FIG. 15 or 16, highly complex and configuration dependent test algorithms may be replaced by simple MARCH-type algorithms. All port-to-port bit line and word line faults are thus detected in addition to the fault types typically detected by the selected algorithm. The only BIST circuitry overhead incurred beyond that of a standard BIST circuit is the addition of port selection and read/write port circuitry, which includes the shadow write enable and port deselect functions for ports in shadow write, and shadow write manufacturing test circuitry to test the shadow write circuitry as described above.

The feature of the embodiments is scalable. Although specific examples are presented, the shadow write feature may be applied to any multi-port memory with any combination of single-ended read-only, write-only or read-write ports. The single-ended shadow write feature may also be used in conjunction with the differential port shadow write feature to sensitize port-to-port bit line and word line shorts in multi-port RAMs with any combination of differential read-only, write-only or read-write ports and single-ended read-only, write-only or read-write ports.

The feature is not limited to SRAM applications. It may be used on any multi-port static memory architecture or multi-port dynamic memory architecture.

Although particular embodiment of the present invention have been described in detail, it should be appreciated that numerous variations, modifications, and adaptations may be made without departing from the scope of the present invention as defined in the claims.

What is claimed is:

1. A multi-port RAM (random access memory) comprising:

RAM cells of m rows by n columns, each RAM cell including storage means for storing differential binary data, the RAM cells being coupled to respective row and column lines of each port, m and n being integers;

data write means for storing differential binary data in the RAM cells selected by signals on the row and column lines of a port;

data read means for reading the differential binary data stored in the RAM cells selected by signals on the row and column lines of a port; and voltage driving means for applying a predetermined level voltage onto selected ones of the column lines in a shadow write mode.

2. The multi-port RAM of claim 1, further comprising test means for determining whether or not the differential binary data read from the RAM cells is expected data.

3. The multi-port RAM of claim 1, wherein the voltage driving means comprises means for driving the predetermined level voltage onto all column lines of at least one selected port in the shadow write mode.

4. The multi-port RAM of claim 1, wherein the storage means for storing differential binary data is a dynamic random access memory element.

5. The multi-port RAM of claim 1, wherein the storage means for storing differential binary data is a static random access memory element.

6. The multi-port RAM of claim 1, wherein the voltage driving means comprises selective drive means for driving the predetermined level voltage onto selected column lines of at least one selected port in the shadow write mode.

7. The multi-port RAM of claim 6, wherein the selective drive means comprises:

M sets of N voltage application means for each port, M and N being integers, the voltage application means being coupled with the respective column lines; and activating means for activating at least one selected one of the voltage application means of the respective set in the shadow write mode, so that the activated voltage application means driving the predetermined level voltage onto the column line which is coupled therewith.

8. The multi-port RAM of claim 7, wherein M is 2 and the activating means alternatively activates one set of the N voltage application means.

9. The multi-port RAM of claim 8, wherein the voltage application means comprises switching means which causes the respective column line to be the predetermined voltage level, in response to a control signal provided by the activating means.

10. The multi-port RAM of claim 9, wherein:

each of the switching means comprises a FET (field effect transistor), the drain-source of which is coupled between the respective column line and a terminal for the predetermined level voltage; and the control signal is selectively applied to the gates of the FETs.

11. The multi-port RAM of claim 10, further comprising means for providing the ground level voltage to the terminal for the predetermined level voltage.

* * * * *